(12) United States Patent
Merrell et al.

(10) Patent No.: US 12,716,790 B2
(45) Date of Patent: Aug. 25, 2026

(54) SYSTEMS AND METHODS FOR DUAL-FUNCTION FOAM PRESSURE SENSORS

(71) Applicant: Nano Composite Products, Inc., Orem, UT (US)

(72) Inventors: Aaron Jake Merrell, Orem, UT (US); Trevor Emil Christensen, Alpine, UT (US); Jake Duane Sundet, Mapleton, UT (US); Ian Matthew Jensen, Provo, UT (US); Maxwell Ira Tree, Provo, UT (US)

(73) Assignee: Nano Composite Products, Inc., Orem, UT (US)

( * ) Notice: Subject to any disclaimer, the term of this patent is extended or adjusted under 35 U.S.C. 154(b) by 195 days.

(21) Appl. No.: 18/706,288

(22) PCT Filed: Nov. 1, 2022

(86) PCT No.: PCT/US2022/079086
§ 371 (c)(1),
(2) Date: Apr. 30, 2024

(87) PCT Pub. No.: WO2023/077168
PCT Pub. Date: May 4, 2023

(65) Prior Publication Data

US 2026/0133083 A1 May 14, 2026

Related U.S. Application Data

(60) Provisional application No. 63/263,369, filed on Nov. 1, 2021.

(51) Int. Cl.
*G01L 1/16* (2006.01)
*G01L 1/20* (2006.01)
(Continued)

(52) U.S. Cl.
CPC ................ *G01L 1/16* (2013.01); *G01L 1/205* (2013.01); *H10N 30/802* (2023.02); *H10N 30/87* (2023.02)

(58) Field of Classification Search
CPC . G01L 19/147; G01L 9/0072; G01L 19/0645; G01L 19/0084; G01L 13/025;
(Continued)

(56) References Cited

U.S. PATENT DOCUMENTS 4,577,510 A * 3/1986 Bur ......................... G01L 9/085 73/754
5,760,530 A 6/1998 Kolesar
(Continued)

FOREIGN PATENT DOCUMENTS

CN 202916004 U 5/2013
CN 106820450 A 6/2017
(Continued)

OTHER PUBLICATIONS

Extended European Search Report for European Application No. 22888595.0, mailed Aug. 26, 2025, 12 pages.
(Continued)

*Primary Examiner* — Andre J Allen
(74) *Attorney, Agent, or Firm* — Brake Hughes Bellermann LLP

(57) ABSTRACT

A pressure sensing system that includes a dual-function foam is disclosed. The dual-function foam may be integrated into padding of a variety of objects to measure pressures and locations of pressures/strains exerted by a user on the padding. The dual-function foam may respond to a pressure/strain with a piezoelectric effect or a piezoresistive effect depending on the nature of the applied pressure/strain. Each effect may require different sensing approaches. Accordingly, the pressure sensor system may include a controller
(Continued)

that is configurable into one of a plurality of operating modes based on the sensing approach suitable for the applied pressure/strain. One of the operating modes may be a sleep mode, which can reduce the power consumed by the controller when no pressure/strain is applied to the dual-function foam for a period.

17 Claims, 13 Drawing Sheets

(51) Int. Cl.
*H10N 30/80* (2023.01)
*H10N 30/87* (2023.01)

(58) Field of Classification Search
CPC ............... G01L 19/0007; G01L 9/0042; G01L 19/0038; G01L 9/0073; G01L 9/0075; G01L 9/0054; G01L 9/0055; G01L 19/04; G01L 7/00; G01L 7/04; G01L 19/148; G01L 19/14; G01L 19/143; G01L 17/00; G01L 7/18; G01L 19/0092; G01L 15/00; G01L 9/0051; G01L 7/041; G01L 9/12; G01L 9/065; G01L 19/0618; G01L 9/0052; G01L 9/125; G01L 7/16; G01L 19/0609; G01L 19/003; G01L 9/007; G01L 19/0627; G01L 19/0046; G01L 9/0022; G01L 9/06; G01L 19/0636; G01L 7/084; G01L 13/02; G01L 19/0023; G01L 19/142; G01L 7/043; G01L 19/08; G01L 9/0002; G01L 19/02; G01L 9/008; G01L 19/141; G01L 9/006; G01L 11/02; G01L 19/0672; G01L 23/10; G01L 23/18; G01L 19/0681; G01L 9/0077; G01L 19/12; G01L 27/005; G01L 7/082; G01L 9/0044; G01L 19/0015; G01L 19/0069; G01L 7/063; G01L 9/0001; G01L 19/146; G01L 21/12; G01L 27/002; G01L 27/007; G01L 9/16; G01L 11/00; G01L 19/00; G01L 9/0026; G01L 9/0089; G01L 9/045; G01L 9/14; G01L 19/0654; G01L 1/2281; G01L 11/025; G01L 13/026; G01L 11/008; G01L 7/22; G01L 13/00; G01L 9/0047; G01L 7/08; G01L 9/0076; G01L 9/0025; G01L 9/0035; G01L 19/0061; G01L 9/0005; G01L 9/0041; G01L 9/0019; G01L 9/08; G01L 9/10; G01L 21/00; G01L 9/04; G01L 11/006; G01L 19/086; G01L 9/00; G01L 9/0008; G01L 1/18; G01L 11/004; G01L 19/069; G01L 9/0057; G01L 19/083; G01L 19/06; G01L 19/10; G01L 19/16; G01L 9/0016; G01L 13/023; G01L 7/048; G01L 9/0048; G01L 9/0027; G01L 9/0086; G01L 9/0079; G01L 11/04; G01L 1/20; G01L 9/0091; G01L 27/00; G01L 11/002; G01L 23/24; G01L 7/182; G01L 1/02; G01L 19/0663; G01L 7/166; G01L 23/22; G01L 9/0036; G01L 9/0061; G01L 9/0039; G01L 23/125; G01L 19/145; G01L 9/0013; G01L 21/04; G01L 9/0045; G01L 9/0092; G01L 1/142; G01L 7/104; G01L 9/0033; G01L 9/0083; G01L 9/0098; G01L 1/2293; G01L 7/24; G01L 9/02; G01L 21/22; G01L 9/0029; G01L 7/022; G01L 1/205; G01L 9/0064; G01L 23/08; G01L 5/14; G01L 13/06; G01L 23/16; G01L 7/088; G01L 7/163; G01L 9/0007; G01L 23/222; G01L 9/025; G01L 1/16; G01L 1/2287; G01L 9/0085; G01L 1/2212; G01L 21/14; G01L 9/0004; G01L 23/02; G01L 9/003; G01L 9/085; G01L 1/14; G01L 1/148; G01L 9/0058; G01L 9/105; G01L 7/02; G01L 7/061; G01L 9/002; G01L 1/2231; G01L 13/028; G01L 9/0095; G01L 23/28; G01L 1/162; G01L 19/0076; G01L 7/12; G01L 9/0038; G01L 9/0032; G01L 21/10; G01L 7/024; G01L 19/149; G01L 1/246; G01L 7/086; G01L 1/005; G01L 5/228; G01L 7/06; G01L 1/2206; G01L 7/102; G01L 13/021; G01L 27/02; G01L 1/2262; G01L 1/24; G01L 1/26; G01L 23/00; G01L 9/0094; G01L 19/144; G01L 9/0082; G01L 1/125; G01L 9/0097; G01L 1/2268; G01L 11/06; G01L 21/30; G01L 21/34; G01L 23/221; G01L 7/187; G01L 7/20; G01L 1/146; G01L 23/26; G01L 7/068; G01L 1/144; G01L 1/225; G01L 23/32; G01L 7/14; G01L 1/165; G01L 23/12; G01L 1/241; G01L 13/04; G01L 7/045; G01L 1/086; G01L 1/22; G01L 7/108; G01L 9/18; G01L 1/127; G01L 17/005; G01L 5/18; G01L 1/245; G01L 21/32; G01L 1/183; G01L 1/2218; G01L 9/0023; G01L 1/243; G01L 23/145; G01L 5/0047; G01L 5/0076; G01L 9/0088; G01L 1/106; G01L 1/10; G01L 9/001; G01L 1/186; G01L 23/223; G01L 25/00; G01L 5/165; G01L 5/226; G01L 9/0017; G01L 1/044; G01L 3/245; G01L 9/005; G01L 1/08; G01L 21/16; G01L 3/1485; G01L 5/0038; G01L 5/162; G01L 5/225; G01L 7/026; G01L 7/065; G01L 9/0014; G01L 1/04; G01L 1/242; G01L 21/24; G01L 3/10; G01L 5/0004; G01L 5/0052; G01L 5/24; G01L 7/10; G01L 1/00; G01L 1/103; G01L 1/2275; G01L 1/247; G01L 21/02; G01L 21/26; G01L 23/225; G01L 3/102; G01L 3/105; G01L 5/223; G01L 7/028; G01L 9/0011; G01L 5/00; G01L 5/0028; G01L 5/243; G01L 1/083; G01L 1/12; G01L 21/36; G01L 23/04; G01L 23/14; G01L 23/30; G01L 3/103; G01L 5/0033; G01L 5/102; G01L 5/133; G01L 5/1627; G01L 5/166; G01L 7/185; G01L 1/255; G01L 21/08; G01L 5/0057; G01L 5/22; G01L 1/042; G01L 1/122; G01L 1/2225; G01L 1/2243; G01L 1/2256; G01L 1/248; G01L 2009/0067; G01L 2009/0069; G01L 21/06; G01L 223/06; G01L 3/00; G01L 3/06; G01L 3/1478; G01L 3/1492; G01L 3/18; G01L 3/24; G01L 3/242; G01L 5/0061; G01L 5/08; G01L 5/10; G01L 5/101; G01L 5/108; G01L 5/16; G01L 5/161; G01L 5/167; G01L 5/28; G01L 1/046; G01L 2009/0066; G01L 19/0053; G01L 23/085; G01L 23/20; G01L 5/0071; G01L 5/008; G01L 5/06; G01L 5/171; G01L 7/106; H10N 30/302; H10N 39/00; H10N 30/082; H10N 30/88; H10N 35/101; H10N 30/03; H10N 30/304; H10N 30/306; H10N 30/87; H10N 30/01; H10N 30/2046; H10N 30/2047; H10N 30/30; H10N 30/308; H10N 30/60; H10N 30/853; H10N 30/02; H10N 30/06; H10N 30/081; H10N 30/101; H10N 30/2041; H10N 30/50; H10N 30/8554; H10N 30/875; H10N 10/17; H10N 10/817; H10N 15/10; H10N 30/04; H10N 30/05; H10N 30/063; H10N 30/071; H10N 30/072; H10N 30/073; H10N 30/076; H10N 30/077; H10N 30/078; H10N 30/2042; H10N 30/706; H10N 30/8536; H10N 30/8548; H10N 30/857; H10N 30/877; H10N 30/878; H10N 35/00; H10N 35/85; H10N 50/85; H10N 52/80

USPC .................................... 73/700–756, 760–800

See application file for complete search history.

(56) References Cited

U.S. PATENT DOCUMENTS 7,181,972 B2 * 2/2007 Dasgupta .................. G01L 9/08 73/705
8,179,018 B2 * 5/2012 Gao ..................... H10N 30/302 310/317
8,904,876 B2 * 12/2014 Taylor ....................... G01L 9/12 361/283.4
9,494,477 B2 * 11/2016 Wiesbauer ................ G01L 9/08
10,260,968 B2 4/2019 Merrell et al.
10,263,174 B2 4/2019 Merrell et al.
10,405,779 B2 9/2019 Merrell et al.
11,329,212 B2 5/2022 Merrell et al.
2006/0137456 A1 6/2006 Dasgupta et al.
2011/0050148 A1 3/2011 Gao et al.
2016/0163959 A1 6/2016 Merrell et al.
2018/0101272 A1 4/2018 Xi et al.
2020/0069220 A1 3/2020 Merrell et al.
2021/0294457 A1 9/2021 Lynn et al.
2022/0276103 A1 * 9/2022 Merrell ................. G01L 5/0052
2024/0044729 A1 * 2/2024 Lee ......................... G01L 1/205

FOREIGN PATENT DOCUMENTS

CN 110426063 A 11/2019
DE 102015104879 A1 10/2015
GB 2542731 A * 3/2017 ........... G01L 9/0005
JP 6302041 B2 * 3/2018 ............... G01B 7/16
KR 20230025710 A * 2/2023 ............. B32B 9/025

OTHER PUBLICATIONS

First Examination Report for Australian Application No. 2022377663, mailed Sep. 4, 2025, 12 pages.

Alin, et al., "Development of flexible tactile sensors for hexapod robots", Mechatronika, 2012 15th International Symposium, IEEE, Dec. 5, 2012, pp. 1-7.

Lu, et al., "Flexible Piezoelectric and Piezoresistive Mechanisms Coupled Sensor for Highly Dynamic and Static Collaborative Detection", 2021 21st International Conference on Solid-State Sensors, Actuators and Microsystems (Transducers) IEEE, Jun. 20-24, 2021, pp. 896-899.

Lu, et al., "Coupling piezoelectric and piezoresistive effects in flexible pressure sensors for human motion detection from zero to high frequency", Journal of Materials Chemistry C, vol. 9, Issue 29, Aug. 7, 2021, pp. 9309-9318.

Sanati, et al., "Development of Nanocomposite-Based Strain Sensor with Piezoelectric and Piezoresistive Properties", Sensors, vol. 18, No. 11, Nov. 6, 2018, p. 3789.

International Search Report and Written Opinion for PCT Application No. PCT/US2022/079086, mailed on Mar. 16, 2023, 11 pages.

* cited by examiner

SYSTEMS AND METHODS FOR DUAL-FUNCTION FOAM PRESSURE SENSORS

CROSS-REFERENCE TO RELATED APPLICATION

This application is a 35 U.S.C. § 371 National Phase Entry Application from PCT Application No. PCT/US2022/079086, filed on Nov. 1, 2022, entitled "SYSTEMS AND METHODS FOR DUAL-FUNCTION FOAM PRESSURE SENSORS", and designating the U.S., which claims the benefit of U.S. Provisional Application, No. 63/263,369, entitled "Foam Pressure-Sensing System" filed on Nov. 1, 2021, which are hereby incorporated by reference in their entireties.

FIELD OF THE DISCLOSURE

The present disclosure relates to pressure sensors and more specifically, to an energy-efficient foam pressure-sensing system that can adjust operation based on load conditions.

BACKGROUND

A pressure sensor may include a transducer configured to convert a pressure (i.e., force per unit area) into a signal (e.g., electrical signal) at an output of the pressure sensor. One type of transducer used in pressure sensors uses a piezoresistive effect in which a resistance of the transducer is changed by a pressure applied to the transducer. The change in resistance does not generate a signal (i.e., is passive), and as a result, circuitry in the pressure sensor may convert the change in resistance to a current or voltage at the output of the pressure sensor. Another type of transducer used in pressure sensors uses a material with a piezoelectric effect in which the material generates a charge in response to an applied pressure. The charge can generate an electric potential, and as a result, circuitry in the pressure sensor may convert the electric potential to a voltage at the output of the pressure sensor. A transducer for a pressure sensor may have the ability to deform. A force applied to the transducer may generate a force per unit area within the transducer (i.e., a stress), which can cause a deformation (i.e., strain) of the transducer. A pressure sensor configured to measure this deformation (i.e., strain) may output a signal corresponding to the strain and therefore may be referred to as a deformation gauge (i.e., strain gauge).

SUMMARY

The present disclosure describes a transient-pressure sensitive and sustained-pressure sensitive (i.e., dual function) sensor that can measure a pressure/strain and location of the pressure/strain of a soft and flexible foam pad, which may be used in a variety of applications in which padding is found. The dual-function sensor may include a foam pad that responds to pressures/strains of various time scales with a piezoresistive response and a piezoelectric response, so that as the foam pad is compressed, changes in the electrical and conductive properties of the foam pad can be measured using a matrix of electrode pairs adhered to a surface of the foam pad. The sensor may process observed (measured) piezoresistive responses and piezoelectric responses according to an operating model. In some implementations, the sensor may use an observed piezoelectric response to turn on a current producing device used to measure piezoresistive response. In some implementations, the sensor may use acceleration data to turn on a current producing device used to measure piezoresistive response. Measurements can be processed to determine the pressure or strain applied to the foam pad, and a location of an applied pressure may be determined by locating a pair of electrodes in the matrix on the surface of the foam pad that measured the change in the electrical or conductive properties.

In some aspects, the techniques described herein relate to a pressure sensing system including: a pressure sensor including: a dual-function foam configured to: generate a piezoelectric effect in response to a transient pressure; and generate a piezoresistive effect in response to a sustained pressure; and an electrode pair disposed on a surface of the dual-function foam; and a controller electrically coupled to the electrode pair, the controller configured to: receive a signal from the electrode pair, the signal corresponding to the piezoelectric effect or the piezoresistive effect; and select an operating mode from a plurality of operating modes based on the signal in order to measure the transient pressure or the sustained pressure, the plurality of operating modes including a static mode in which the controller is configured to measure the piezoresistive effect of the sustained pressure and a dynamic mode in which the controller is configured to measure the piezoelectric effect of the transient pressure.

In some aspects, the techniques described herein relate to a method for sensing pressure, including: receiving a signal from an electrode pair disposed on a dual-function foam, determining a frequency content of the signal; comparing the frequency content of the signal to a frequency threshold; measuring a transient pressure on the dual-function foam according to a voltage of the dual-function foam when the signal has frequency content above the frequency threshold; and measuring a sustained pressure on the dual-function foam according to a resistance of the dual-function foam when the signal has frequency content below the frequency threshold.

In some aspects, the techniques described herein relate to a pressure sensing system including: a pressure sensor including: a dual-function foam configured to change electrical properties according to a strain applied to the dual-function foam; a matrix of electrode pairs disposed on a surface (including on only a portion of the surface) of the dual-function foam, the electrode pairs arranged contiguously in a grid pattern so that the electrode pairs substantially cover the surface of the dual-function foam; and a controller electrically coupled to the electrode pairs, the controller configured to: receive signals from the electrode pairs, the signals from the electrode pairs corresponding to local strains in areas defined by the electrode pairs; and convert the local strains to a map of pressures on the surface of the dual-function foam.

The foregoing illustrative summary, as well as other example objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

Figure 1:
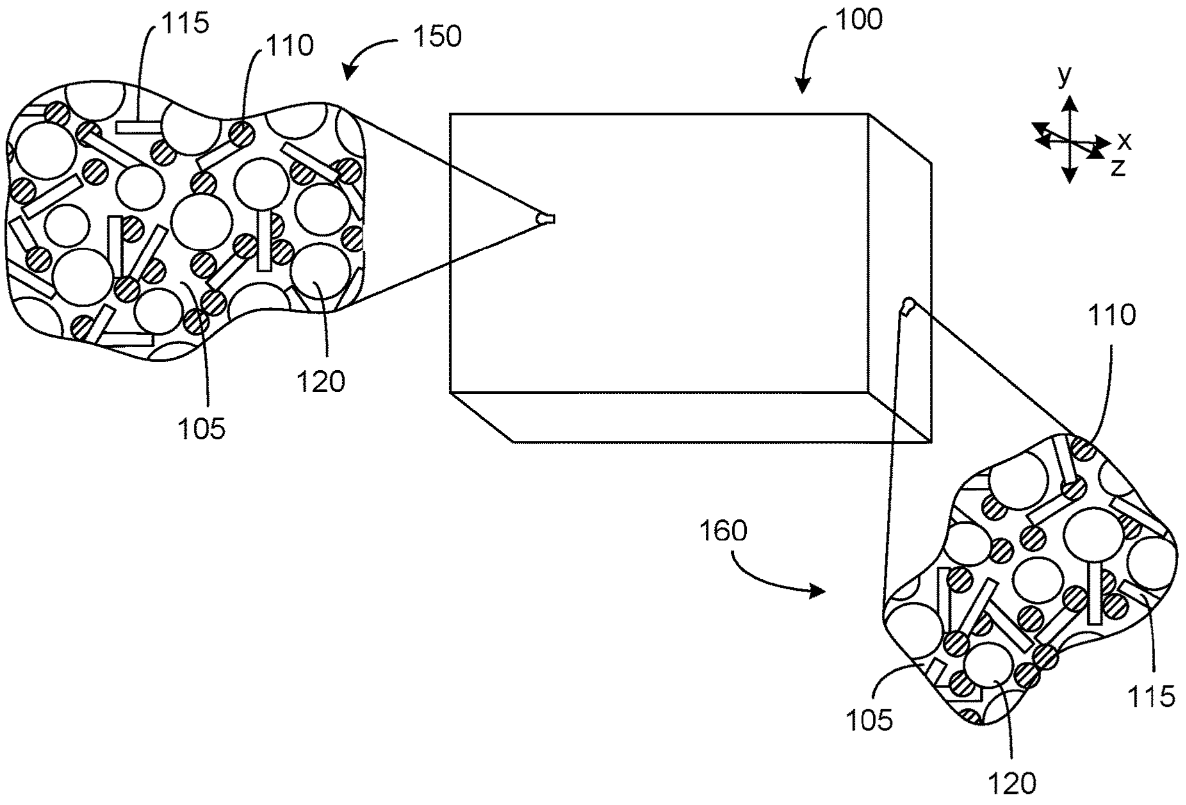
FIG. 1 is a dual-function foam according to a possible implementation of the present disclosure.

A pressure sensing system that includes a dual-function foam pressure sensor is disclosed. The dual-function foam pressure sensor is configured to respond to an applied force. The pressure sensing system can be configured to measure a pressure as the applied force per unit area and measure a strain as the displacement of the foam resulting from the applied force. Accordingly, in what follows force, pressure, and strain may be used interchangeably.

The dual function of the foam pressure sensor relates to a time scale of the applied pressure (force, strain). In a first function, the dual-function foam pressure sensor may be configured to measure a change in resistance to characterize a pressure applied to the sensor for a prolonged period (i.e., sustained pressure). In a second function, the dual-function foam pressure sensor may be configured to measure a change in voltage to characterize a pressure applied to the sensor for a brief period (i.e., transient pressure). In other words, a transient pressure is a pressure that exists on the foam for a first period that is shorter than a second period on which the sustained pressure exists on the foam. For example, a transient pressure may correspond with an impact force (e.g., object colliding with the foam) while a sustained pressure may correspond with a prolonged force (e.g., object resting on the foam).

The dual function described above may be facilitated by a composite polymeric foam (i.e., dual-function foam) that exhibits a piezoresistive effect in response to sustained pressure and transient pressure (impacts) and a piezoelectric effect in response to impact (i.e., transient pressure). The piezoresistive response of the foam may be used to measure a sustained pressure, while the piezoelectric response of the foam may be used to measure a transient pressure (i.e., force, strain). Another advantage of the foam is that the piezoresistive and piezoelectric response to a pressure may be localized in an area containing the point of the force creating the pressure. Accordingly, the foam response may be spatially sampled to determine location information related to an applied force.

One technical problem facing a pressure-sensing system utilizing the dual-function foam described above is that the electrical measurements required for each pressure type (i.e., sustained or transient) may be different but the expected pressure type is not always known and may change over time. Another technical problem facing a pressure-sensing system is that the electrical measurements may consume power, but many applications require long periods of inactivity between sensing. The present disclosure describes a sensing system with multiple modes of operation to address these technical problems.

The disclosed pressure sensing system can automatically adjust its measurement mode (i.e., operating mode, state, etc.) according to a response of the foam to an applied pressure so that the sensor can (e.g., automatically) measure both transient and sustained pressures using a dynamic mode and a static mode, respectively. Further, the disclosed multimode sensing system can include a sleep mode in which consumed power is reduced during periods of inactivity. The pressure sensing system using the dual-function foam pressure sensors may advantageously allow for sensing in a wide range of applications, and in what follows, a few possible applications will be described. These applications may advantageously use the cushioning of the dual-function foam to incorporate sensing into existing padding/cushioning.

FIG. 1 is a high-level schematic diagram of a dual-function foam that exhibits a piezoelectric response and a piezoresistive response. For example, the dual-function foam may generate a negative piezoresistive response (i.e., reduced electrical resistance) in response to a compressive strain and a positive piezoresistive response (i.e., increased electrical resistance) in response to a tensile strain. The dual-function foam may generate a piezoelectric response for compressive and tensile strain alike. The piezoelectric response may occur for a short duration (less than a second) after a start of a strain event where the piezoresistive response may occur for the duration of a strain event.

The dual-function foam 100 is a composite material including several components: a matrix 105, conductive fillers, and voids 120. The voids 120 and conductive fillers may be uniformly dispersed throughout the matrix 105. The matrix 105 may be any polymer, such as a silicone-based material, a polyurethane material, a latex material, a polyethylene material, an Ethyl Vinyl Acetate (EVA) material, other foam-like material, or elastomeric polymer, that retains its shape after deformation. The composite material includes voids 120 throughout the material. In other words, the matrix 105 has elasticity, porosity, and high failure strain (e.g., from 50% to 1000% strain). Due to the elasticity of the matrix 105, the dual-function foam 100 may be able to measure strain (e.g., 80% strain) without permanent deformation.

The conductive fillers can include conductive nanoparticles 110. Conductive nanoparticles 110 are particles with at least one dimension that measures one thousand nanometers or less and that are made from a material that conducts electricity. Examples of such conductive materials include carbon black, nickel, platinum, gold, silver, copper, and the like.

The conductive fillers can also include conductive stabilizers 115. Conductive stabilizers 115 may be any conductive material that acts as a stabilizer. In one implementation, the conductive stabilizers 115 may be fibers coated with a material that conducts electricity. For example, the conductive stabilizers 115 may be carbon fibers coated with pure nickel. In some implementations, the fibers may be coated approximately 20-40% by weight with the conductive material. The fibers may be cut to short lengths, for example from 0.1 to 1 mm. The fibers may have a diameter of up to 10 μm (e.g., 0.2 micrometers (μm), 1 μm, 5 μm, 8 μm). In some implementations, the fibers may be hollow (e.g., tubes). In some implementations, the fibers may be carbon fibers, nickel-coated carbon nanotubes (CNTs) or nickel-coated carbon fibers (NCCFs).

The conductive stabilizers 115 may increase the strength and energy absorption capabilities of the dual-function foam 100. The conductive nanoparticles 110 may also increase the strength and energy absorption capabilities of the dual-function foam 100, but in some cases, to a lesser extent than the conductive stabilizers 115. In some implementations, the conductive nanoparticles 110 may be a primary conductive filler (i.e., constitute a majority of the conductive fillers) and the conductive stabilizers may be a secondary conductive filler (i.e., constitute a minority of the conductive fillers). For example, a composite material may be loaded with 5% carbon black and 3% carbon fibers (by weight). In some implementations, the conductive stabilizers 115 can be aligned (e.g., using a magnet during the curing process or by allowing the foam to expand in a particular manner) to facilitate conduction of electricity or heat.

The conductive nanoparticles 110 and the conductive stabilizers 115 may not be easily visible without magnification, such as magnification areas 150 and 160. At a microscopic level, e.g., illustrated by magnification areas 150 and 160, the components of the composite material may be distinguishable, but may be generally dispersed in a consistent or even manner along any axis (x, y, z). Thus, while not exactly the same, the general composition of areas 150 and 160 are similar even at the microscopic level. Because the conductive fillers (e.g., conductive nanoparticles 110, conductive stabilizers 115) are mixed with, and thus disposed throughout, the matrix 105, the dual-function foam 100 is uniform. Put another way, the dual-function foam 100 does not have layers and its composition is generally consistent at a macroscopic (e.g., naked eye) level from outer surface (outer wall) to outer surface.

The dual-function foam 100 can exhibit a change in its electrical resistance when compressed. In particular, the dual-function foam 100 can become less resistive to an electrical current as a strain on the dual-function foam is increased (i.e., negative piezoresistive effect). The piezoresistive effect may relate to a change in a mechanical configuration of the conductive fillers resulting from the strain (i.e., deformation). For example, a compression of the dual-function foam 100 may move the conductive fillers closer together. In other words, gaps between the conductive fillers may be reduced by compressing the dual-function foam.

During an initial period of sustained strain, the piezoresistive response does not suffer from drift, e.g., the resistance correlates to a known strain. The initial period can be at least an hour or two. The initial period can be dependent on the type of matrix 105 used and whether the sensor is part of a material stack and the determination of the initial period can be determined via a configuration process at the time of manufacturing. After the initial period, the electrical resistance generated by the pressure may decrease (e.g., because the same pressure results in increasing strain over time due to relaxation of the foam over time). The decrease results from drift, e.g., a different piezoresistive response to the same strain of the composite material. The drift in the piezoresistive response can be compensated for by a material model. The material model may include a time duration for the initial period, calibration data for the initial period, a time duration for a second period and calibration data for the second period, a time duration for a third period and calibration data for the third period, etc. The material model is determined at manufacture and is specific to the composition of the strain sensor, including the amount and type of conductive fillers used, the type of matrix 105 used, whether the dual-function foam 100 is part of a stack, the other materials used in the stack, etc. For example, at manufacturing time, a testing procedure may test the foam over different strain rates/sustained loads checking for relaxation or hysteresis over time. The material model can be used by the system to provide accurate (drift/creep-free) measurements of pressure over long periods of time.

The dual-function foam 100 can exhibit a voltage (i.e., piezoelectric effect) when compressed. In particular, the dual-function foam 100 can generate a charge in response to pressure on the foam. The charge may be generated through a triboelectric effect between the matrix and the conductive fillers resulting from a strain. For example, the nanoparticles 110 and/or the conductive stabilizers 115 may collect a charge as they are moved in the matrix, when the dual-function foam is compressed (or stretched). The charge may generate a first electric potential at a first side of the dual-function foam 100 and a second (different) electric potential at a second (i.e., opposite) side of the dual-function foam 100, thereby generating a voltage across the dual-function foam. The voltage across the dual-function foam can change according to the applied pressure. For example, a larger pressure may correspond to a larger voltage than a smaller pressure. Accordingly, the piezoelectric effect of the dual-function foam may be used for transient pressure events, such as impacts, while the piezoresistive effect of the dual-function foam may be used for non-transient (e.g., sustained) pressure monitoring.

Figure 2:
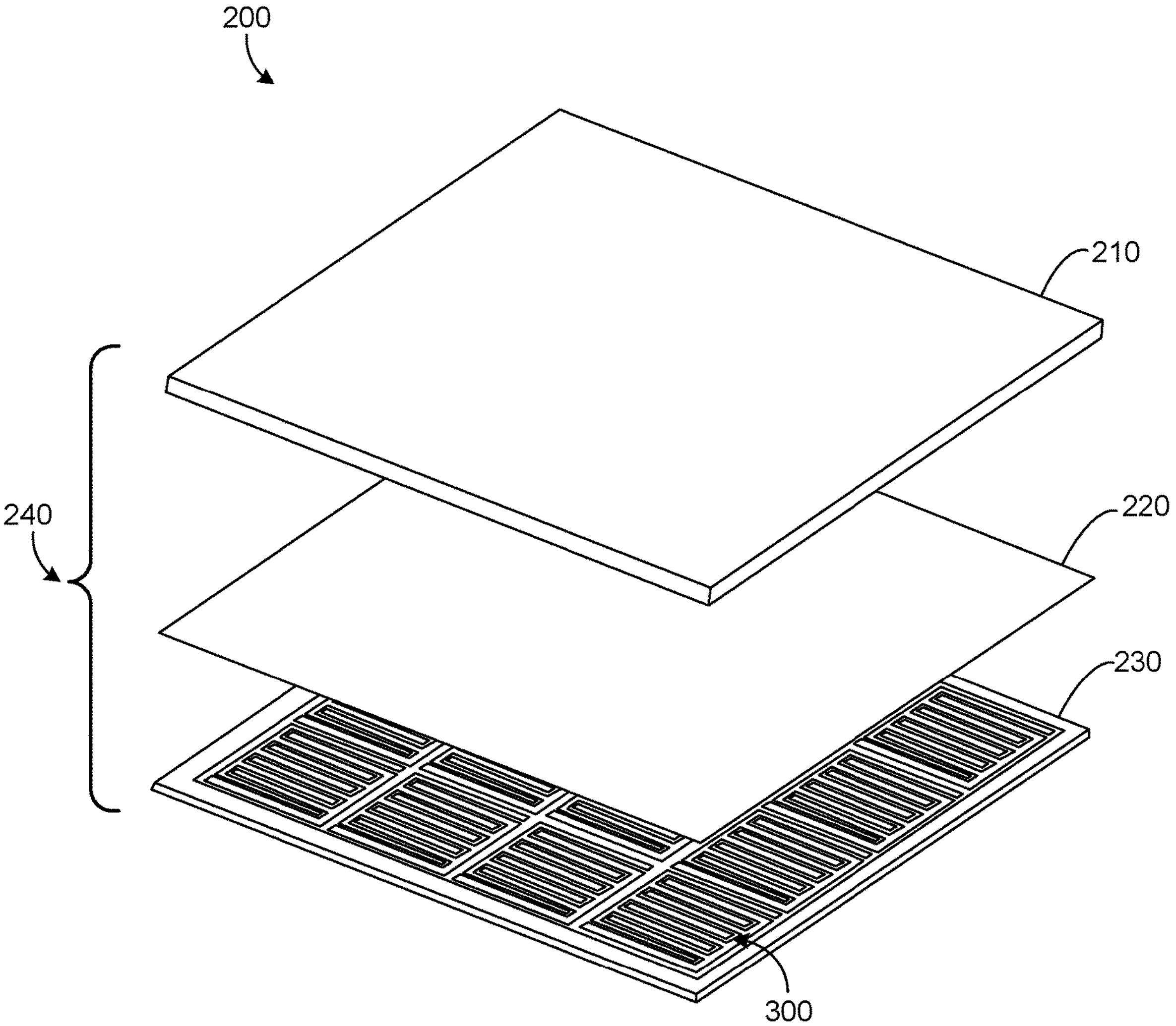
FIG. 2 is a perspective, exploded view of a pressure sensor according to a possible implementation of the present disclosure.

FIG. 2 is a perspective, exploded view of a pressure sensor 200 according to a possible implementation of the present disclosure. The pressure sensor 200 may include a material stack 240 that includes a dual-function foam pad (i.e., foam pad 210) mechanically coupled to a matrix of electrode pairs (i.e., electrode matrix 230) by an adhesive sheet 220. In a possible implementation the adhesive sheet is a conductive adhesive sheet. In a possible implementation the material stack 240 further includes a shielding layer. The shielding layer may be positioned between the electrode matrix 230 and a user (e.g., human pressing on the foam pad 210) to prevent the user from electrically (e.g., capacitively) loading the electrodes.

The electrode matrix can include pairs of conductive traces (i.e., electrodes) disposed (e.g., etched) on a flexible substrate (e.g., polyimide). The electrode pairs can be arranged side-by-side (i.e., contiguously) in a grid pattern to substantially cover a surface of the foam pad 210. Each electrode pair can be used to electrically interface with a corresponding area of the foam pad 210. A sshown, the electrode matrix 230 includes 4 rows and 4 columns so that 16 electrode pairs cover 16 different areas of the foam pad 210. Accordingly, 16 electrical signals from the sixteen electrode pairs may be monitored to sense 16 pressures/strains in the 16 different areas of the foam pad 210. Although not illustrated in FIG. 2, the pressure sensor 200 can have additional layers, e.g., a textile covering, a second layer of the foam pad 210, a layer for support, etc. Additionally, some implementations may include a second pressure sensor 200 (not shown in FIG. 2). The second pressure sensor 200 may have a dual function foam with a different composition than the first pressure sensor 200. The different composition makes the first pressure sensor 200 have a different stiffness than the second pressure sensor 200. The differences in stiffness enable a system to measure a larger range of pressures. In some implementations, the sensors of different stiffness can be proximate each other. In some implementations, the sensors of different stiffness can be on different sides of the electrodes (e.g., the electrodes/PCB is sandwiched between the two sensors).

An electrical change caused by a pressure, or a strain measured by an electrode pair in the electrode matrix 230 may represent the average pressure or strain in the area defined by the electrode pair. Accordingly, the electrode matrix 230 shown in FIG. 2 may be used to create a map of pressures and/or strains on the surface of the foam pad 210. A map represents the foam pad. The map can include two dimensions corresponding to a plane on which the electrode pairs of the foam pad are arranged and a third dimension related to the pressure and/or strain measured by each electrode pair.

Figure 3:
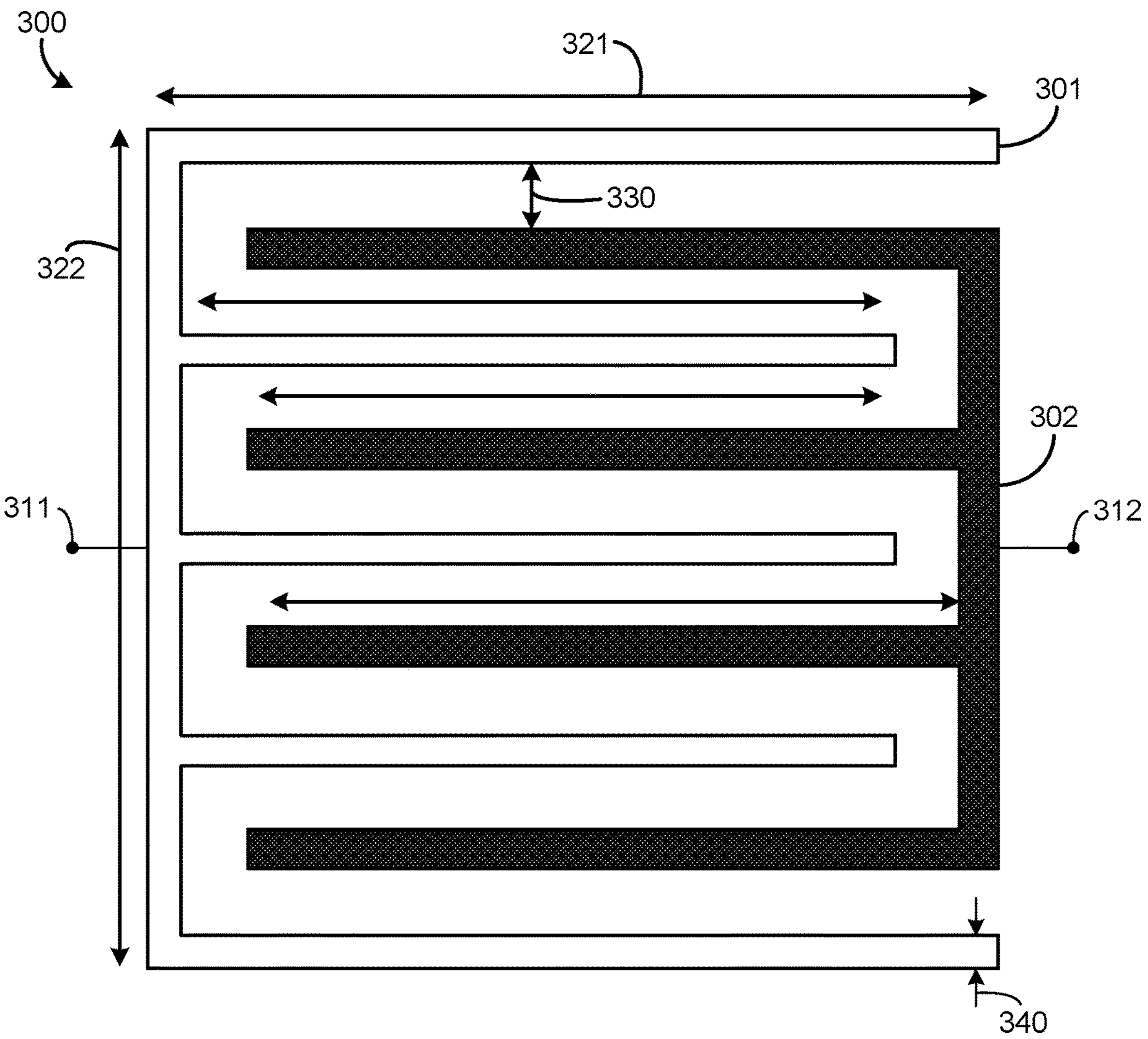
FIG. 3 is a top view of an electrode pair according to a possible implementation of the present disclosure.

FIG. 3 is a top view of an electrode pair according to a possible implementation of the present disclosure. The electrode pair 300 includes a first electrode 301 and a second electrode 302. The first electrode may be coupled electrically (e.g., to a controller) at a first connection point 311 and the second electrode 302 may be coupled electrically (e.g., to the controller) at a second connection point 312. The first electrode 301 may include a first plurality of fingers and the second electrode 302 may include a second plurality of fingers that are interdigitated, as shown. The interdigitated electrodes are coplanar and cover an area defined by a width 321 and a height 322. The electrodes may define an electrode gap 330 between a finger pair that may be the same for each finger pair and may define an electrode width 340. A pressure measurement can be affected by the electrode gap 330 and the electrode width 340 of an electrode pair. For example, an electrode gap greater than 0.5 millimeter (mm) (e.g., 1 mm gap) and electrode width greater between 1 mm and 2 mm (e.g., 1.5 mm) may be used to sense pressure. The electrode pair may be electrically coupled to at any location within the perimeter of the pad, such as at the first connection point 311 and the second connection point 312, as shown. Gap width affects the sensitivity of the sensor, with smaller gaps corresponding to increased sensitivity. Gap width is directly related to the sensing foam electrical properties. Generally, lower resistance sensors require smaller gap widths than higher resistance materials. The gap width is optimized for each foam formulation with higher conductive dual sensing foams accommodating larger gaps.

Measuring a force on the foam pad may include sensing a change in capacitance, inductance, impedance, and/or resistance at the electrode pairs. For example, an alternating current (AC) signal (e.g., pulse width modulation (PWM) signal) at a frequency can be applied to an electrode pair to obtain a response. At lower frequencies (e.g., ≤100 Hz) the foam has a greater change in capacitance than resistance in response to applied pressure, but the change is not very consistent. At higher frequencies (e.g., >1 kHz), the foam has a greater change in resistance than capacitance and the change may be consistent especially as the frequency is increased (e.g., 6 kHz≤f≤50 kHz).

FIGS. 4A-4F are detection circuits for interfacing with electrode pairs of a pressure sensor according to possible implementations of the present disclosure. In the detection circuits a PWM signal can be coupled to a first connection point 311 of the electrode pair 300 of the pressure sensor 200 to generate a response signal at a second connection point 312 of the electrode pair of the pressure sensor 200. The detection circuit may include an amplifier (e.g., Op Amp, Resistor). The detection circuit may further include a capacitor configured to block direct current (DC) signals from reaching an analog-to-digital converter (ADC) configured to digitize the signals from the pressure sensor 200. The detection circuit may further include a multiplexer (MUX) to select electrode pairs of the electrode matrix 230. The multiplexer (MUX) may be positioned at various locations of the detection circuit.

Figure 4A:
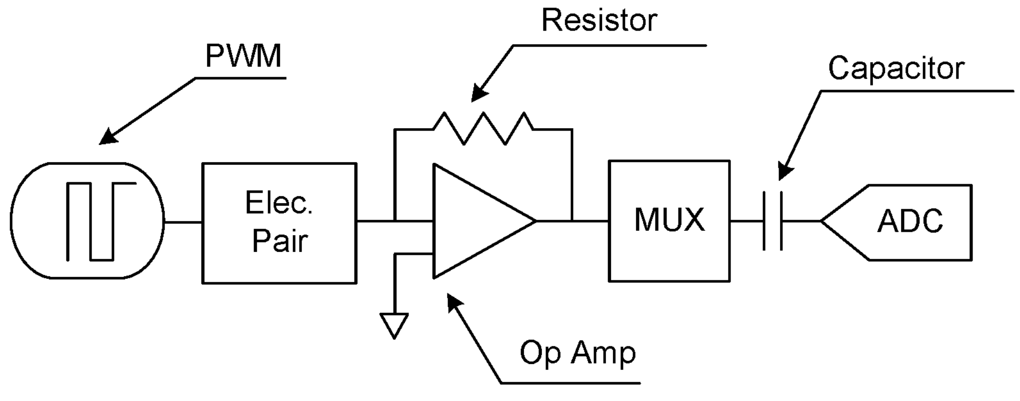
FIGS. 4A-4F are circuits for interfacing with electrode pairs of a pressure sensor according to possible implementations of the present disclosure.

In a first implementation of the detection circuit shown in FIG. 4A, the multiplexer (MUX) is configured to couple amplified signals from each electrode pair to an ADC. In other words, each electrode pair of an electrode matrix 230 may have a corresponding amplifier and the MUX may couple the amplifiers to the ADC.

Figure 4B:
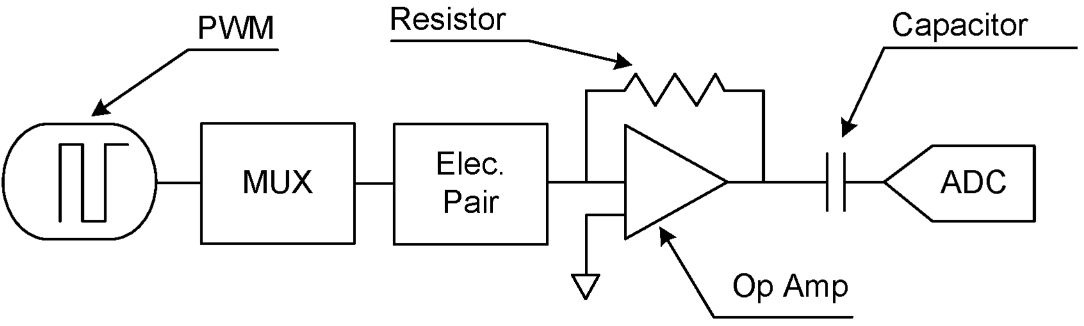

In a second implementation of the detection circuit shown in FIG. 4B, the multiplexer (MUX) is configured to couple PWM signals to each electrode pair. In other words, each electrode pair of an electrode matrix 230 may have a corresponding amplifier and ADC.

Figure 4C:
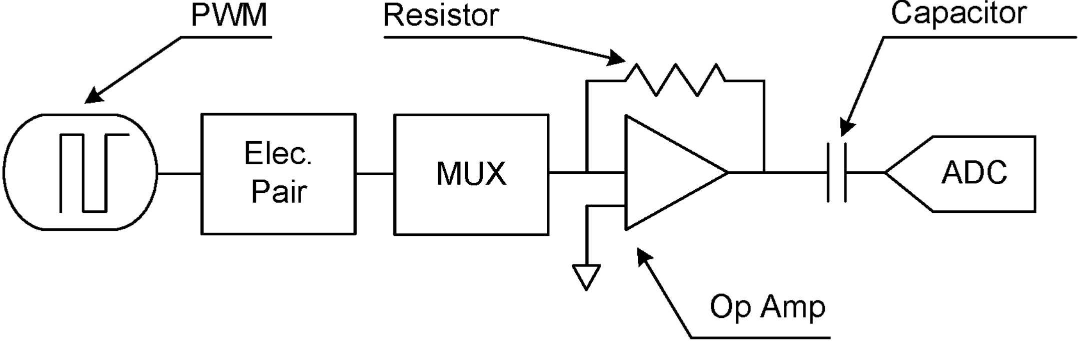

In a third implementation of the detection circuit shown in FIG. 4C, the multiplexer (MUX) is configured to couple signals from each electrode pair to an amplifier (e.g., non-inverting Op Amp). In other words, each electrode pair of an electrode matrix 230 may be directly coupled to the multiplexer (MUX).

Figure 4D:
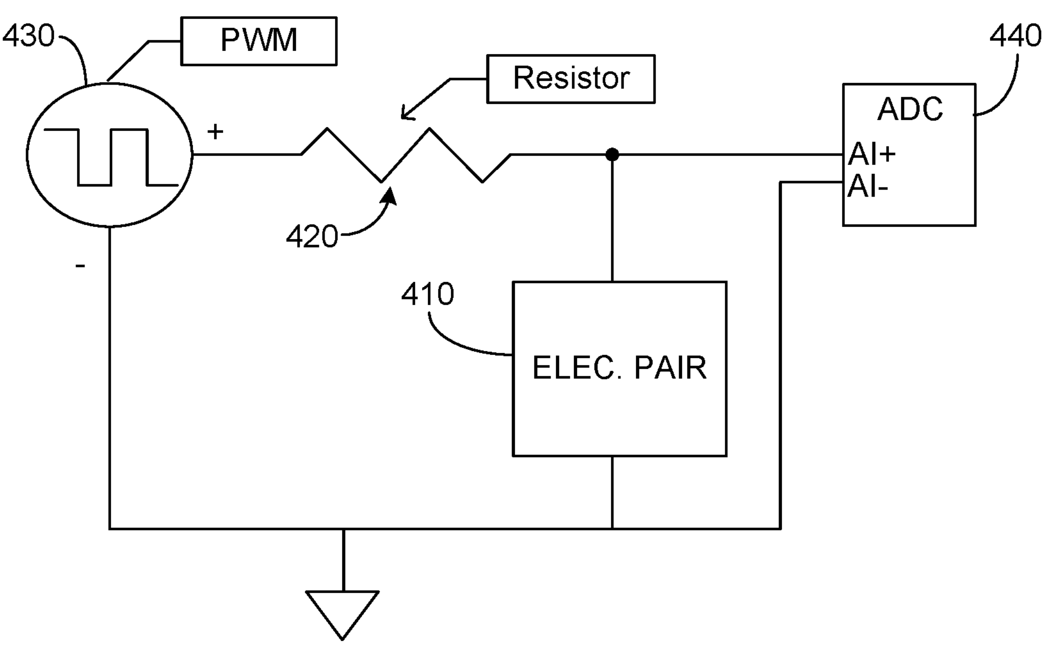

In a fourth implementation of the detection circuit shown in FIG. 4D, a voltage divider is formed between an electrode pair 410 and a resistor 420 for measuring a pressure signal (e.g., voltage drop) generated by the pressure sensor in response to an applied pulse-width-modulation signal (PWM 430). The output of the voltage divider is coupled to an analog-to-digital converter (ADC 440) to digitize the pressure signal.

Figure 4E:
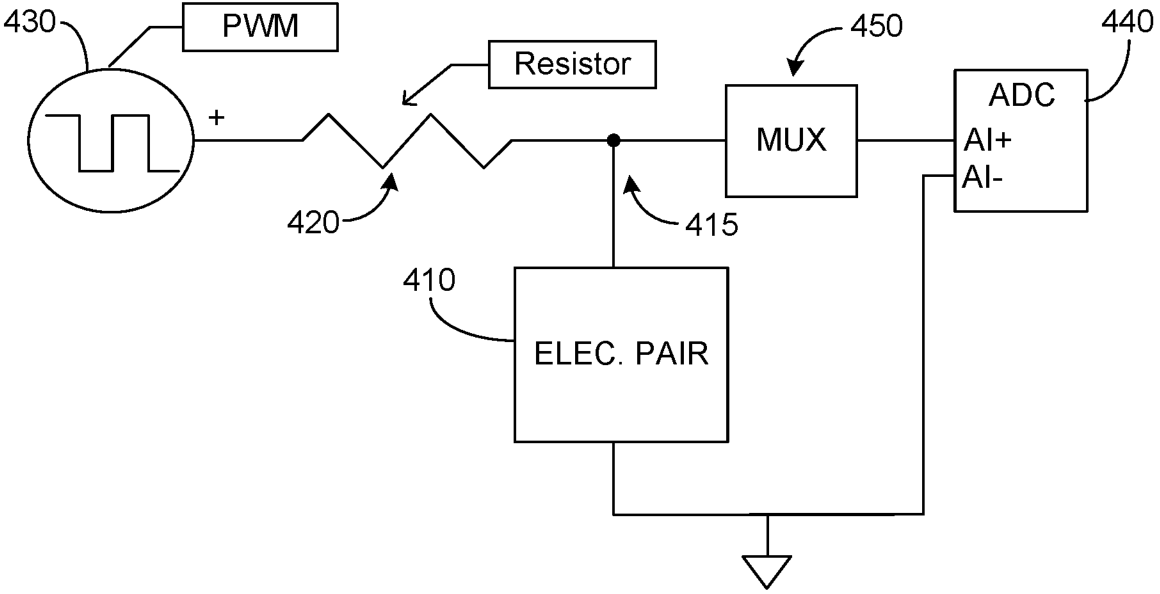

In a fifth implementation of the detection circuit shown in FIG. 4E, a voltage divider is formed between the electrode pair 410 and the resistor 420 for measuring a pressure signal (e.g., voltage drop) generated by the pressure sensor in response to the applied PWM signal (PWM 430) and the detection circuit further includes a multiplexer 450 configured to couple a positive analog input pin (AI+) of the ADC 440 to a voltage node 415 in between the resistor 420 and the electrode pair 410 of the sensor. The multiplexer 450 may be used to couple the ADC 440 similarly to other detection circuits (not shown). This design allows for a higher number of sensing locations while using a low number of ADC pins.

Figure 4F:
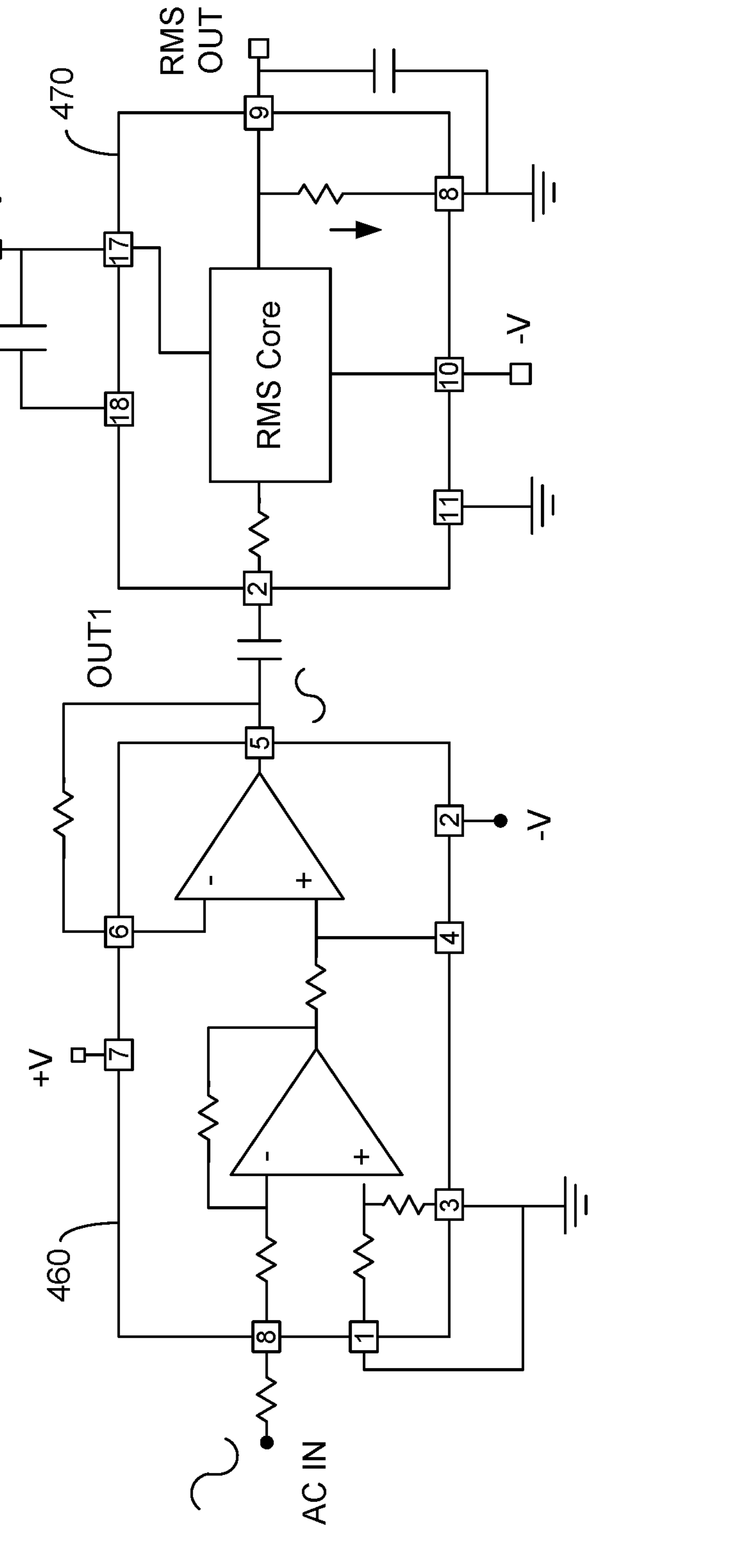

In a sixth implementation of the detection circuit shown in FIG. 4F, a change of resistance of the pressure sensor can be sensed as a DC voltage (RMS OUT) in response to an alternating current (AC) input signal (AC IN). The DC voltage (RMS) represents the peak-to-peak voltage of the AC input signal (AC IN) and the resistance of the pressure sensor. The circuit includes an amplification stage 460 configured to amplify an alternating current (AC) input signal (AC IN), which is coupled at its output (OUT1) to an RMS core circuit 470. The RMS core circuit 470 may be configured to sense a resistance change of the pressure sensor as a voltage.

Signals from electrode pairs of electrode matrix 230 of the pressure sensor 200 can be measured nearly simultaneously with the use of a multiplexer which can cycle through measurements from each electrode pair location. One method to correlate the electrical signal from an electrode pair to a pressure/strain is a root mean square (RMS) signal. In particular, a relationship between the voltage root mean square (RMS) output and the displacement of the foam can be expressed in the equation below, in which $x_i$ are measured values n is the number of measurements (e.g., sample period).

$$RMS = \sqrt{\frac{1}{n}\sum x_i^2} \quad (1)$$

In some implementations, the RMS signal can be determined through a schematic such as shown in FIG. 4F described previously, where the output of the circuit is a DC voltage that represents the peak-to-peak voltage and represents the resistance of the foam pressure sensor.

Figure 5:
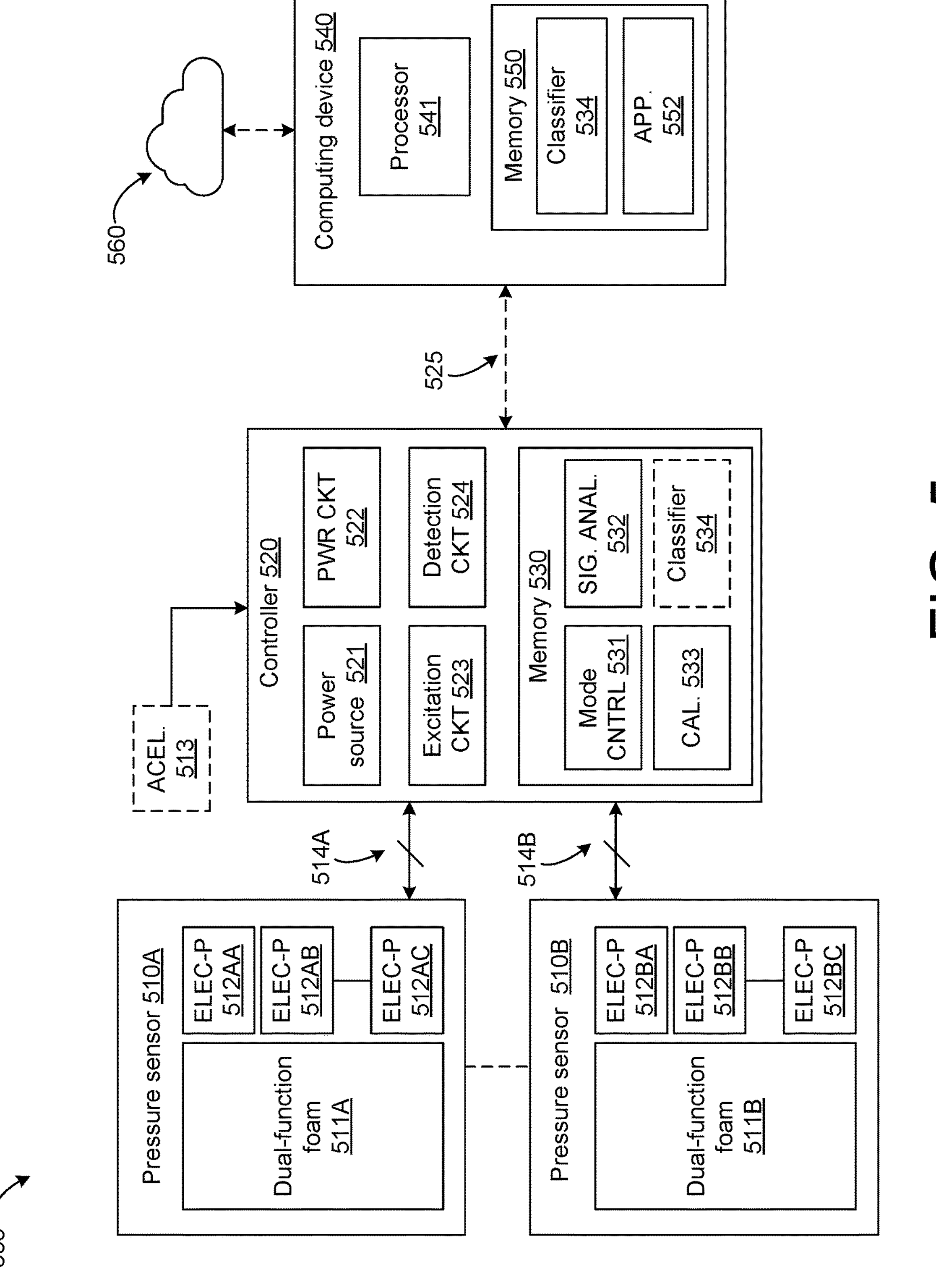
FIG. 5 is a block diagram of a pressure sensing system according to a possible implementation of the present disclosure.

FIG. 5 is a pressure sensing system according to a possible implementation of the present disclosure. The pressure sensing system includes at least one pressure sensor. For example, the pressure sensing system 500 can include a first pressure sensor 510A and a second pressure sensor 510B. The first pressure sensor 510A may include a first dual-function foam pad 511A affixed to (e.g., bonded) an electrode matrix having a first number of electrode pairs 512AA, 512AB, 512AC. The second pressure sensor 510B may include a second dual-function foam pad 511B affixed to (e.g., bonded) to an electrode matrix having a second number of electrode pairs 512BA, 512BB, 512BC. The first number and the second number may be the same or different.

The electrode pairs of the first pressure sensor 510A may be communicatively coupled (e.g., electrically coupled) over multiple transmission lines 514A or a common bus (e.g., wired or wireless) to a controller 520. The electrode pairs of the second pressure sensor 510B may be communicatively coupled (e.g., electrically coupled) over multiple transmission lines 514B or a common bus (e.g., wired or wireless) to the controller 520 The controller may be configured by software instructions (i.e., software, firmware, etc.) recalled from a memory 530 of the controller 520. The software/firmware may be configured to interact with signals from the electrode pairs detected by a detection circuit 524. FIGS. 4A-4C illustrate (non-limiting) examples of the detection circuit 524. The software may further adjust the operation of the controller 520 and its circuitry in response to the signals.

The pressure sensors 510A, 510B may be installed as the padding of an apparatus. For example, the pressure sensors 510A, 510B may be installed in a shoe insole in areas of the insole to best sample pressure of portions (e.g., heel, ball) of a foot standing on the shoe insole. Other possible apparatus applications may include a pressure mat, a seat, padding on robotic arms/fingers/graspers, and a bed/bedding pad. In a possible implementation, the controller 520 is also integrated with (e.g., included in) the application. In some implementations, the pressure determined at the different pressure sensors (e.g., 510A, 510B) can be summed to determine a weight of the object exerting the pressure.

The controller 520 may receive a plurality of signals from the electrode pairs of the pressure sensors 510A, 510B. The controller may also receive signals from an accelerometer 513 integrated with (e.g., included in) the apparatus. An accelerometer included in the apparatus is considered operationally coupled to the sensors (e.g., 510A, 510B) and the controller 520. Signals from the accelerometer 513 may indicate a motion of the apparatus, which may be used to determine an operating mode of the controller 520. For example, the accelerometer 513 may sense the motion of the shoe insole.

The controller 520 may include a power source 521, such as a battery, and a power circuit 522 configured to control the operation of the controller with respect to an amount of energy drawn from the power source 521. For example, the power circuit 522 may configure the controller 520 into a sleep mode to reduce an amount of power drawn from the power source 521. Reducing the amount of power can include reducing the amount of power applied between pairs of electrodes to zero. The power circuit 522 may be triggered to configure the controller into the sleep mode in response to a no sensed activity from the pressure sensors 510A, 510B for a period of time (e.g., time-out period). In a possible implementation, sensing activity may include comparing signals from the electrode pairs of the pressure sensors to an activity threshold. For example, when a detected signal from an electrode pair is below a predetermined activity threshold (e.g., is approximately zero (±1%)), then no sensed activity may be concluded. A timer (e.g., software or hardware) may be started when the threshold criterion is satisfied, and if no activity is sensed for a time-out period, then the power circuit may be configured to reduce the power consumed from circuitry in the controller, such as by disabling circuit operation in the controller to reduce a power drawn from the power source 521. For example, a reduction of the consumed power from a battery can extend an operating life of a controller 520 powered by the battery.

As mentioned, the software that configures the controller for various functions may be stored in a memory 530 of the controller 520. In other words, the controller 520 may be considered as a processor that can be configured by software instructions (i.e., software modules, software programs) recalled from the memory 530 of the controller 520. As a result, the memory 530 of the controller 520 may include a plurality of software programs for various functions.

The plurality of software programs may include a mode controller 531 configured to control the operation of the controller 520 according to an operating mode selected from a plurality of operating modes. In other words, the mode controller 531 may operate as a state machine that moves the controller from one state to another based on signals from the pressure sensors (e.g., via the detection circuit 524). For example, one possible operating mode includes a sleep mode, such as described above.

The plurality of software programs may further include a signal analyzer 532. The signal analyzer 532 may be configured to analyze a signal corresponding to a piezoelectric effect or the piezoresistive effect caused by a pressure on the pressure sensor. The signal analyzer may be configured to process (e.g., filter, smooth, bias, combine, etc.) the signal and/or determine aspects of the signal. For example, the signal analyzer may be configured to determine the frequency content of the signal. In a possible implementation, the signal analyzer 532 may be configured to determine if the signal has a frequency above a frequency threshold. In another possible implementation, the signal analyzer 532 may receive a transmit signal transmitted by an excitation circuit 523 of the controller, receive a signal from an electrode pair in response to the transmit signal, determine (i.e., measure) a resistance of the dual function foam based on the transmit signal and the received signal. In another possible implementation, the signal analyzer 532 may compare the measured resistance to an expected resistance (i.e., for a non-compressed sensor) to compute a sustained pressure corresponding to the piezoresistive effect of the dual-function foam. The expected resistance from the non-compressed sensor may be determined from a calibration of the dual-function foam in a particular material stack (e.g., a material model for the pressure sensor). The outputs of the signal analyzer 532 may be pressure signals that can be sampled and stored by location (e.g., corresponding to electrode pair position) and/or by time.

The plurality of software programs may further include a calibration 533. The calibration 533 may include values to represent a response of a pressure sensor to a transient or sustained pressure. For example, the expected resistance of the dual function foam may be stored in a look-up table. The calibration may also include a model (e.g., mathematical equation, neural network, lookup table, database, etc.) in which measurement (e.g., measured resistance, measured voltage) is related to a characteristic of the foam (e.g., strain rate) under various conditions (e.g., temperature from a temperature sensor (not shown)). The model may be generated using a calibration process. The calibration process may be performed at a time of fabrication (e.g., factory set).

The plurality of software programs may further include a classifier 534. The classifier 534 may be configured to receive the pressure signals. The classifier 534 may be configured to determine feedback for an application. For example, a classifier 534 may be configured to map the determined local strains in areas defined by electrode pairs and convert the local strains to a map of pressure on the surface of the dual-function foam. Based on this map the classifier 534 may be able to determine a feedback signal which can be used to alert a user (a caretaker or person using the apparatus), change a position of a user to change the pressure map, or to otherwise improve a condition for a user.

In an alternate implementation, one or more of the plurality of software programs (e.g., mode controller 531, signal analyzer 532, calibration 533, or classifier 534) that configure the controller 520 to perform a function may be stored in a memory 550 of a computing device 540 and communicated from the computing device 540 to the controller 520 over a wireless communication link 525. In other words, the controller 520 and the computing device 540 may form a split-computing architecture in which processing for the pressure sensing system is distributed between the devices. In a possible implementation, the computing device 540 is a mobile computing device, such as a laptop, mobile phone, tablet, etc. The computing device 540 can be communicatively coupled to the controller 520 over a wireless communication link 525 (e.g., WiFi, Bluetooth, NFC, 5G, etc.).

The computing device 540 may include a processor 541 that can be configured by software instructions (i.e., software modules, software programs) recalled from the memory 530 to cause the computing device 540 to perform a function (or functions). As a result, the memory 530 of the computing device 540 may include a plurality of software programs for various functions performed by the computing device 540.

The plurality of software programs may further include the classifier 534 as described above and may further include an application 552. The application 552 may be for presenting or understanding the classification of the pressures measured by the pressure sensing system 500. Accordingly, a user may interact with the application 552. Some possible applications will be described below.

Figure 6:
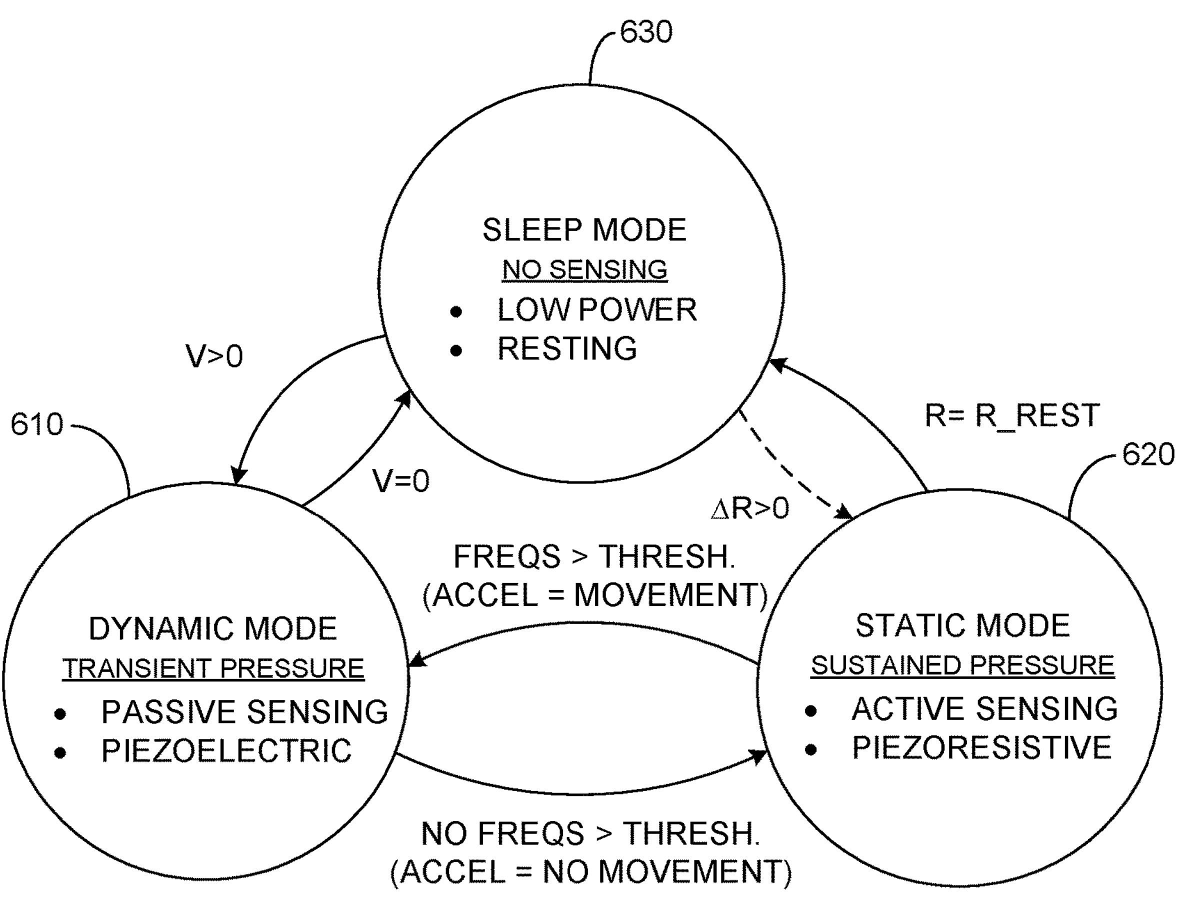
FIG. 6 is a state diagram of operating modes of a controller for a pressure sensing system according to a possible implementation of the present disclosure.

FIG. 6 is a state diagram of operating modes of a controller for a pressure sensing system, such as system 500 shown in FIG. 5. The controller may be configured to receive a signal from an electrode pair that corresponds to the piezoelectric effect or the piezoresistive effect of the dual-function foam. Based on this signal, the controller may be configured to select an operating mode from a plurality of operating modes to measure a transient pressure or a sustained pressure on a pressure sensor. In other words, the controller may be configured to move between operating modes according to conditions at the pressure sensors.

As shown in FIG. 6, the plurality of operating modes may include a dynamic mode 610. In the dynamic mode of operation, the controller is configured to measure a piezoelectric effect of the pressure sensor. For example, a transient pressure (e.g., impact) on the dual-function foam may create a voltage as a result of the piezoelectric effect of the foam. The controller may passively sense this voltage. In other words, the controller does not need to transmit a transmit signal to the electrode pair in order to sense the transient pressure and the piezoelectric effect occurs without power source. The signal from the electrode pairs in the dynamic mode may have a spectrum (i.e., frequency content) that includes one or more frequencies above a frequency threshold. Accordingly, the dynamic mode 610 may be entered when the signal from the electrode pair has a frequency detected above the frequency threshold and the static mode 620 may be entered when the signal from the electrode pair has no frequency detected above the frequency threshold. In implementations that reduce power when not in the static mode 620, moving to the static mode 620 may restore power levels, i.e., wake the controller.

In some implementations, an accelerometer may be used to enter the dynamic mode 620 and stay in the dynamic mode. In such implementations, movement sensed by an accelerometer may indicate the system observes transient pressure events. Accordingly, the dynamic mode 610 may be entered when a signal from an accelerometer indicates movement (i.e., a movement signal from the accelerometer). In some implementations, when the accelerometer indicates movement, the controller may be configured to reduce power consumption from a power source while in the dynamic mode 610. In other words, because power is not needed to sense transient strain events, the controller may be configured to conserve power, e.g., by reducing an amount of power applied to electrode pairs to zero while the controller performs passive sensing.

As shown in FIG. 6, the plurality of operating modes may include a static mode 620. In the static mode of operation, the controller is configured to measure a piezoresistive effect of the pressure sensor. For example, a sustained pressure on the dual-function foam may create a change in resistance as a result of the piezoresistive effect of the foam. This change in resistance may be actively sensed by the controller. In other words, the controller is configured to transmit a transmit signal to the electrode pair in order to sense the sustained pressure. The received signal from the electrode pairs in response to the transmit signal may have a spectrum (i.e., frequency content) that includes no frequencies above a frequency threshold. Accordingly, the controller may remain in the static mode 620 while the received signal from the electrode pair has no frequency above the frequency threshold or move to dynamic mode 610 when the received signal from the electrode pair has a frequency above the frequency threshold. Alternatively, no movement sensed by an accelerometer may indicate a sustained pressure. Accordingly, the controller may remain in static mode 620 when a signal from an accelerometer indicates no movement or move to dynamic mode 610 when the signal from the accelerometer indicates movement.

As shown in FIG. 6, the plurality of operating modes may include a sleep mode 630. In the sleep mode of operation, the controller is configured to lower its power because the dual-function foam is in a resting state (i.e., no sustained pressure and no transient pressure). The sleep mode 630 may be entered from the dynamic mode 610. For example, when no voltage (e.g., V=0) is measured for a time-out period (e.g., dynamic time-out period), then the controller may enter sleep mode 630. The time-out period in the dynamic mode 610 (e.g., the dynamic time-out period) can be measured in seconds (e.g., a few seconds long). The controller may consume less power in the sleep mode 630 than in the dynamic mode 610.

The sleep mode 630 may also be entered from the static mode 620. For example, when no resistance change (DR) is measured for a time-out period (e.g., static time-out period), then the controller may enter sleep mode 630. In other words, when the dual-function foam has a resting resistance (R=R_REST) for the time-out period, then the controller may enter sleep mode 630. In some implementations, the time-out period in the static mode 620 can be measured in minutes (e.g., 1 minute, 10 minutes). In some implementations, the static time-out period is the same as the dynamic time-out period. The controller may consume less power in the sleep mode 630 than in the static mode 620.

The controller may exit the sleep mode 630 to the dynamic mode 610 or (optionally) the static mode 620 based on the response of the pressure sensor. In one possible implementation, exiting sleep mode 630 (i.e., waking the controller) may include configuring the controller to monitor a voltage of an electrode pair, and when the voltage exceeds a threshold (e.g., V>0) then waking the controller by entering the dynamic mode 610. In the dynamic mode 610, the frequency content of the voltage is analyzed to determine whether to remain in the dynamic mode 610 or move to the static mode 620. When a pressure sensor includes a matrix of electrode pairs, then the controller may be configured to monitor one or more (e.g., all) of the electrode pairs in the matrix of electrode pairs while in the sleep mode 630 and to wake from the sleep mode when a voltage satisfying a criterion (e.g., exceeding a threshold) is detected at any of the monitored electrode pairs.

Figure 7:
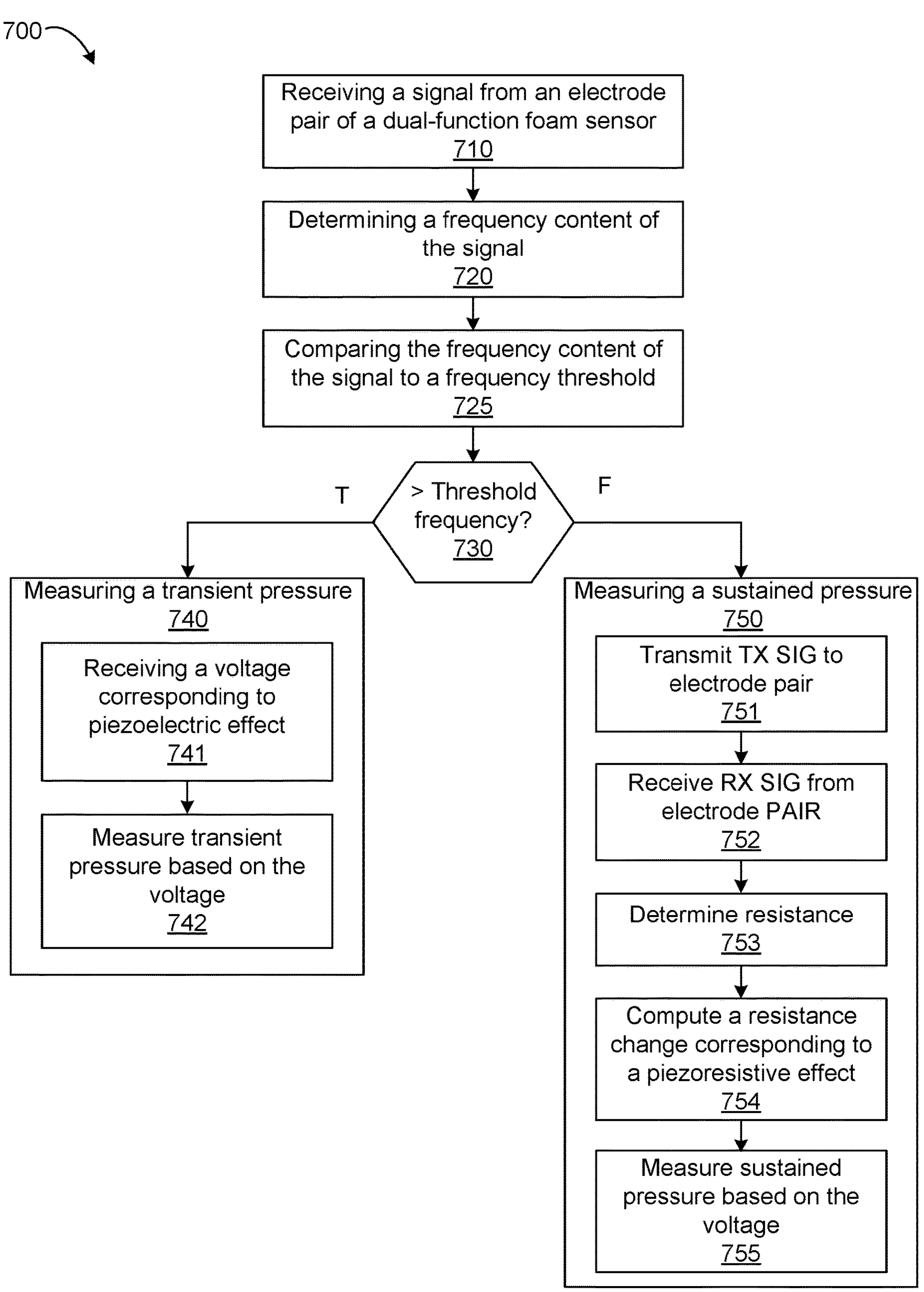
FIG. 7 is a flow chart of a method for sensing pressure according to a possible implementation of the present disclosure.

FIG. 7 is a flow chart of a method for sensing pressure according to a possible implementation of the present disclosure. The method 700 includes receiving 710 (e.g., at a controller) a signal from an electrode pair of a pressure sensor including a dual-function foam (i.e., dual-function foam sensor). The method 700 further includes determining 720 a frequency content of the signal and comparing 725 the frequency content to a frequency threshold. For example, a time-based signal may be transformed (e.g., via a discrete Fourier transform) to a frequency-based signal to determine frequency content. The frequency content may include frequencies corresponding to the signal that are above a frequency threshold. When at least one of the frequencies above a frequency threshold have a magnitude above a predetermined amount 730, then the method 700 includes measuring 740 a transient pressure on the dual-function foam sensor. When none of the frequencies above the frequency threshold have a magnitude above a predetermined amount 730, then the method 700 includes measuring 750 a sustained pressure on the dual function foam sensor.

Measuring 740 a transient pressure on the dual-function foam sensor may include receiving 741 a voltage of the dual-function foam that corresponds to a piezoelectric effect of the dual-function foam in response to the transient pressure and measuring 742 the transient pressure based on the voltage.

Measuring 750 a sustained pressure on the dual-function foam sensor may include transmitting 751 a transmit signal (e.g., PWM signal) to an electrode pair of the pressure sensor and receiving 752 a receive signal from the electrode pair in response to the transmit signal. Measuring 750 the sustained pressure may further include determining 753 the resistance (i.e., measured resistance) of the dual-function foam based on the transmit signal and the received signal. Measuring 750 the sustained pressure may further include computing 754 a difference between the resistance and an expected resistance. The difference corresponds to a piezoresistive effect of the dual-function foam in response to the sustained pressure and measuring 755 the sustained pressure based on the difference. In a possible implementation, the difference is a root mean square error between the resistance and the expected resistance over a sample period.

Returning to FIG. 5, the pressure sensing system 500 may be used to sense pressure in implementations in which padding is used. The computing device 540 may receive the pressures from a controller 520. Alternatively, or additionally, the computing device 540 may receive profiles (e.g., pressure maps, pressure trends, recognized pressures, etc.) from the controller 520. An application 552 (i.e., APP) running on a processor 541 of the computing device 540 may manipulate information (e.g., pressures, profiles, etc.) received from the controller 520 in a meaningful way for a user in the context of the implementation. In a first example, the application 552 may configure the processor 541 of the computing device to store the information received from the controller 520 to a memory 550 on the computing device or to a device coupled to a network 560 in communication with the computing device. In another example, the application 552 may configure the processor 541 to generate an alert (e.g., sound, light, graphic, etc.) on the computing device 540 and/or on a device coupled to a network 560 in response to the information received from the controller 520. In another example, the application 552 may configured the processor to display the information on a graphical user interface (GUI) of the computing device 540 based on the information received from the controller 520. The GUI may provide a means for a user to interact with the information received from the controller 520.

Based on the discussion thus far, various implementations of the pressure sensing system may be envisioned. In what follows, several possible implementations are described. It is recognized that variations, additions, and/or substitutions to the implementations described are within the scope of the present disclosure when they carry out the general ideas conveyed by the implementations described below.

A first possible implementation is bedding. In the bedding implementation pressure sensors are integrated with a bedding surface. For example, a pressure sensor (or pressure sensors) could be integrated in a mattress, a mattress top, or a mattress sleeve to sense a pressure exerted by a user lying on the mattress. The dual-function foam and the electrode matrix of a pressure sensor (e.g., see FIG. 2) can measure and locate (i.e., map) pressure points on the user. Calibration of the pressure sensor can be used to facilitate consistent and accurate measurements. In a care-giving location (e.g., hospital), bedding with a pressure sensor (i.e., smart bedding) can be used to monitor pressure locations/magnitudes (i.e., pressure maps) experienced by bed-bound patients. The pressure sensing system (e.g., see FIGS. 4A-4C) may include an application 552 that can record pressure maps over time to provide live feedback of pressure locations and magnitudes. This information can be used to determine when a pressure surpasses a critical level (i.e., magnitude threshold) or duration (i.e., time threshold), which can provide an alert to allow the caretakers to adjust the patients to reduce the probability of pressure sore development or other bed-acquired conditions. When this information is repeatedly measured and saved, pressure values of the smart bedding can be tracked over a period of time. This information can also be used as feedback to adjust the bedding to provide comfort to a user by removing high pressure points. This feedback may be transmitted to a bed that is communicatively coupled to the pressure sensing system (e.g., via a network 560) so that the adjustment may occur automatically in a bed configured for automatic adjustment (i.e., mechanical adjustment, pneumatic adjustment).

Figure 8:
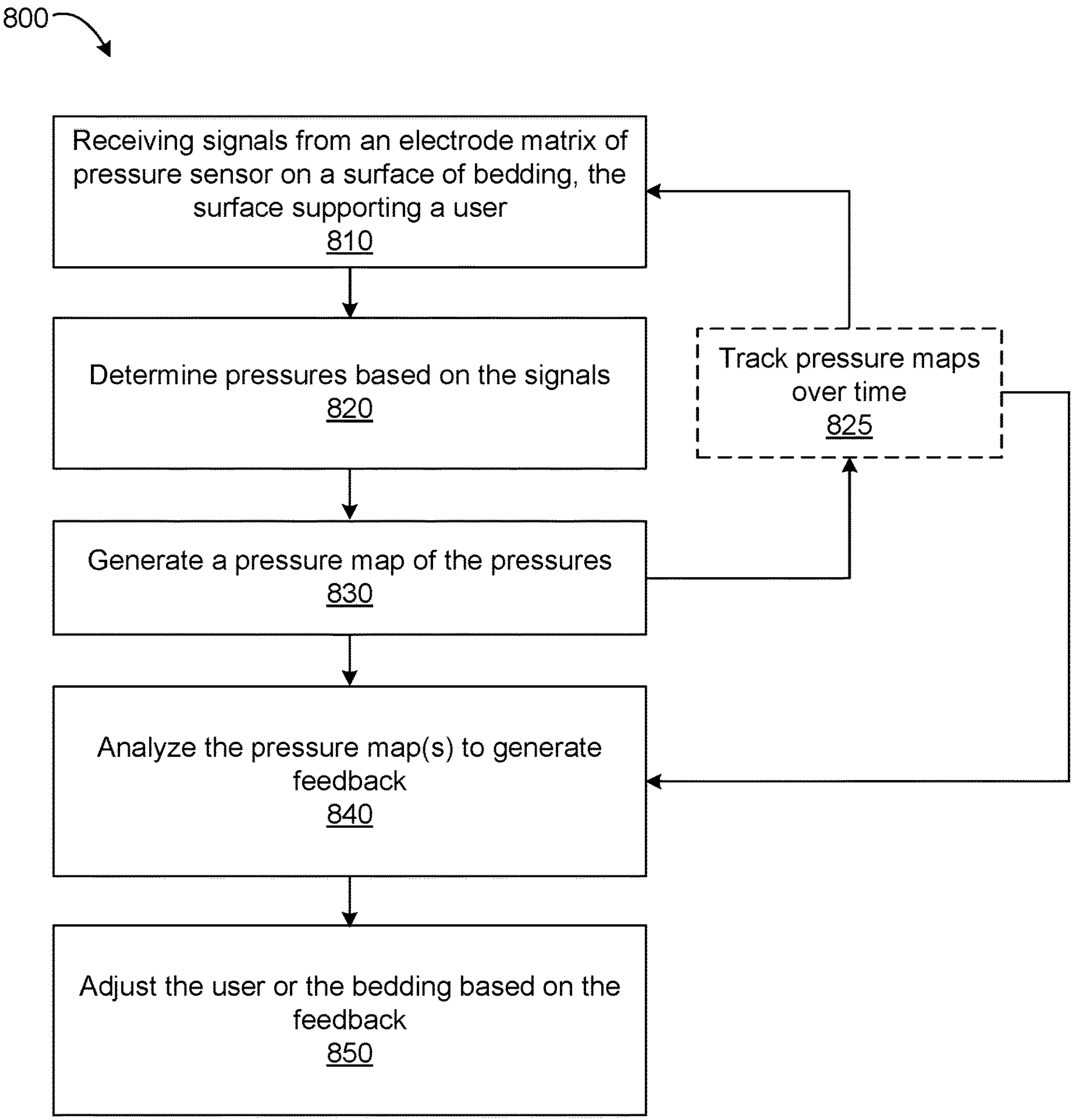
FIG. 8 is a flow chart of a method for sensing pressure in a bedding implementation of the present disclosure.

FIG. 8 is a flow chart of a method for sensing pressure in a bedding implementation of the present disclosure. The method 800 includes receiving 810 signals from an electrode matrix of a pressure sensor disposed on a surface of bedding (i.e., surface supporting a user). The method 800 further includes determining 820 pressures based on the received signals and generating 830 a pressure map of the pressures. The method 800 may include tracking 825 the pressure maps over time. The method 800 then includes analyzing 840 the pressure map (or pressure maps over time) to generate feedback (e.g., alert, bed control signal, etc.). The method 800 then includes adjusting 850 the user or the bedding based on the feedback.

A second possible implementation is seating. In the seating implementation, pressure sensors are integrated with a seat surface or seat surfaces (e.g., back surface, leg surface). The seat may include an automatic adjustment mechanism that can receive feedback from the pressure sensing system. Accordingly, the seat surface (or surfaces) can respond (e.g., in real time) to pressure and/or force changes by the user. Specifically, this sensor system can be used in car seats which may be configured to generate feedback from the pressure information to adjust the seat to change pressure. The change in pressure may result in a more comfortable and/or ergonomic position for the user. This seat adjustment may use any system to adjust the lumbar support, stiffness of any part of the seat, or shape of any part of the seat. The pressure sensing system may include a plurality of pads (i.e., pressure sensors), depending on a size of the seat and the size of the electrode pairs in the electrode matrix. The seats with pressure sensors (i.e., smart seats) may be used in a variety of environments, including (but not limited to) automotive seats, wheelchairs, office chairs, and home chairs. In all these uses, the dual-function foam could be integrated as part of the chair or be placed on top of the seat to provide force, pressure, and location information (e.g., pressure maps). The pressure information provided by the pressure sensors of the seats can be used to adjust the seat automatically (or manually). The adjustment may provide a better fit or improve the comfort of a user. In the case of the wheelchair, the pressure information can also be used to sense the motion of the user and provide feedback to adjust the wheelchair or user for better (e.g., more natural) movement. In some implementations, the pressure map may be associated with a particular user and adjust the seat to match a particular configuration pre-set by the user including seat position, settings within the car (i.e., mirror placement, pedal location, temperature controls, etc.)

Figure 9:
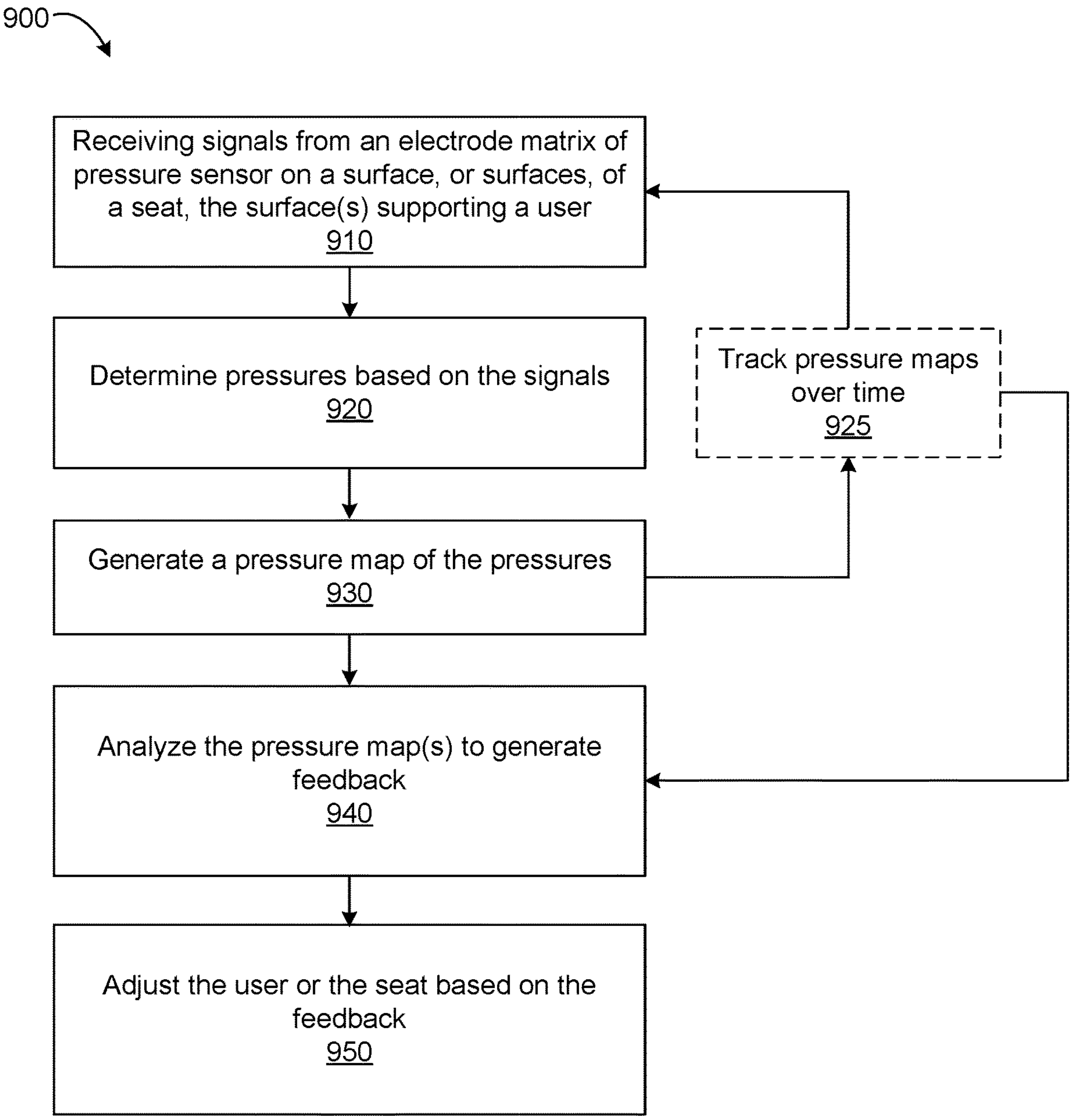
FIG. 9 is a flow chart of a method for sensing pressure in a seating implementation of the present disclosure.

FIG. 9 is a flow chart of a method for sensing pressure in a seating implementation of the present disclosure. The method 900 includes receiving 910 signals from an electrode matrix of a pressure sensor (or pressure sensors) disposed on a surface (or surfaces) of a seat. The method 900 further includes determining 920 pressures based on the received signals and generating 930 a pressure map of the pressures. The method 900 may include tracking 925 the pressure maps over time. The method 900 then includes analyzing 940 the pressure map (or pressure maps over time) to generate feedback (e.g., alert, bed control signal, etc.). The method 900 then includes adjusting 950 (e.g., automatically adjusting) the user or the seat based on the feedback.

A third possible implementation is a pressure mat. In the pressure mat implementation, one or more pressure sensors may be arranged to cover a surface of the pressure mat. The pressure mat may be placed on the floor for a user to stand on. The pressure mat can be configured to measure the location and magnitude of the forces (i.e., pressure map) exerted by the user on the pressure mat. The pressure maps may provide feedback that can aid in sporting, physical therapy, and human performance applications to visualize ground reaction forces and center of pressure to improve form and performance. An application running on a computing device (e.g., phone, computer, smart TV, etc.) of the pressure sensing system may be configured to provide immediate feedback of the distribution of weight during a swing, pitch, exercise, or any dynamic or static motion. The application may configure a processor to display the pressure information to the user in real time, as well as record the changes in pressure over time to a memory for later display. Further the application may be configured to recognize pressures as a movement and to generate feedback (e.g, instructions, tips, etc.) to help a user improve the movement (e.g., golf swing) based on a comparison of the recognized movement and a stored movement (e.g., ideal movement). The feedback could be for exercises to improve form, maximize rehab, or improve performance. The pressure mat may also be used in strength training, sports including (but not limited to) golf, baseball, and basketball, rehabilitation, or security, safety (e.g., door control), and/or movement monitoring. For example, during lower-limb rehabilitation or with other semi-ambulatory patients, a pressure mat may be set up around their living space to alert others of falls or other irregularities in their mobility.

Figure 10:
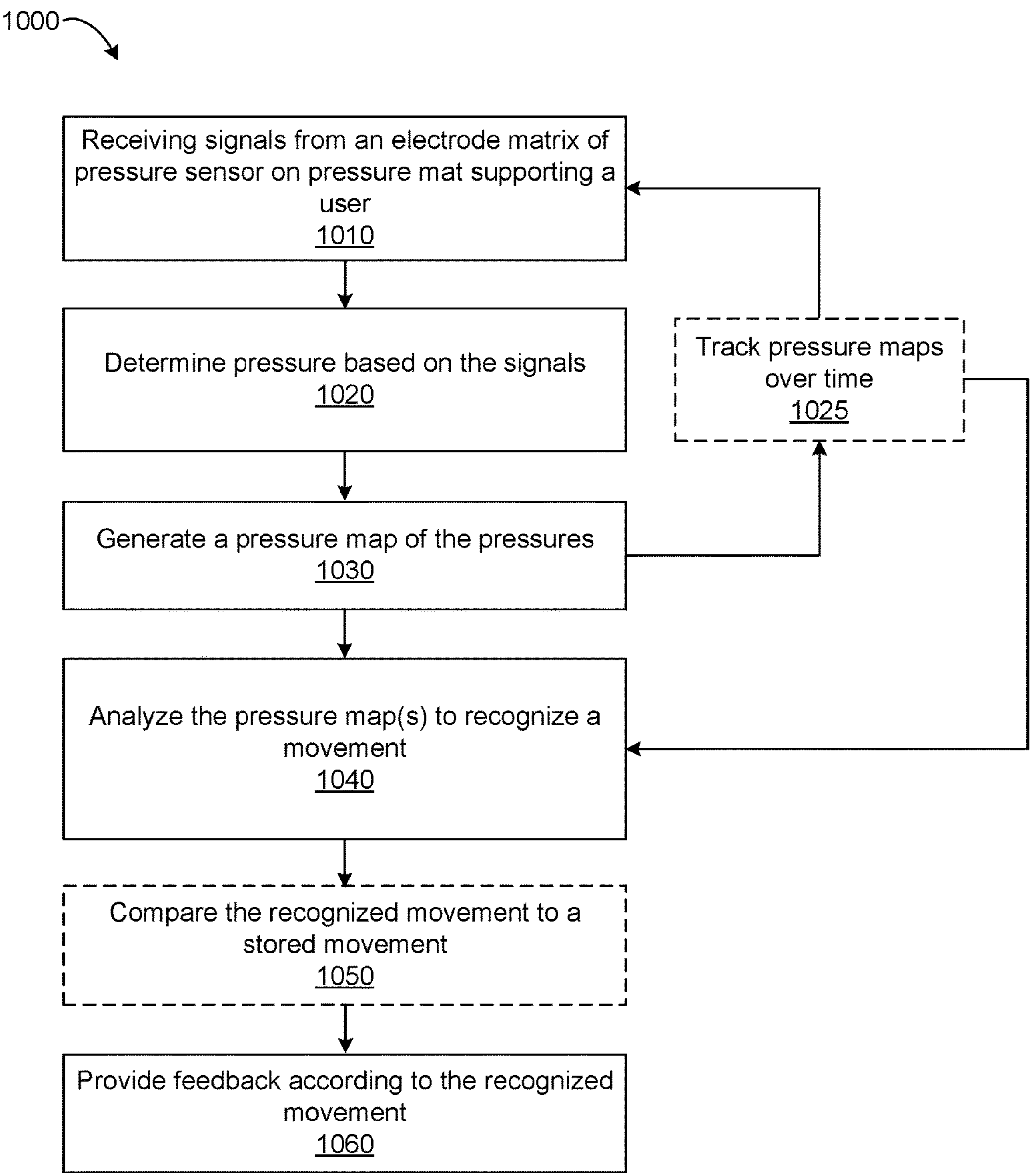
FIG. 10 is a flow chart of a method for sensing pressure in a pressure mat implementation of the present disclosure.

FIG. 10 is a flow chart of a method for sensing pressure in a pressure mat implementation of the present disclosure. The method 1000 includes receiving 1010 signals from an electrode matrix of a pressure sensor (or pressure sensors) disposed on a surface (or surfaces) of a pressure mat. The pressure mat may be placed on a floor or ground for a user to step onto (or stand on). The method 1000 further includes determining 1020 pressures based on the received signals and generating 1030 a pressure map of the pressures. The method 1000 may include tracking 1025 the pressure maps over time. The method 1000 then includes analyzing 1040 the pressure map (or pressure maps over time) to recognize a movement. For example, a classifier may be configured to output a recognized movement based on a plurality of pressure inputs. The method 1000 may optionally include comparing 1050 the recognized movement to a stored movement (e.g., database of movements). The method 1000 may then include providing 1060 feedback according to the recognized movement.

A fourth possible implementation is a shoe insole. In the shoe insole implementation, a pressure sensor (or pressure sensors) may be laid out in the shape of a shoe insole. Multiple electrode matrices may be placed in areas of the foot that give measurements corresponding to a distribution of pressure while a user is standing, walking, running, or sitting. An application of the pressure sensor system can be configured to provide feedback to help a user determine the comfort of a particular pair of shoes or the effect that an injury, developmental issue, or wearable has on their static or dynamic stance.

Figure 11:
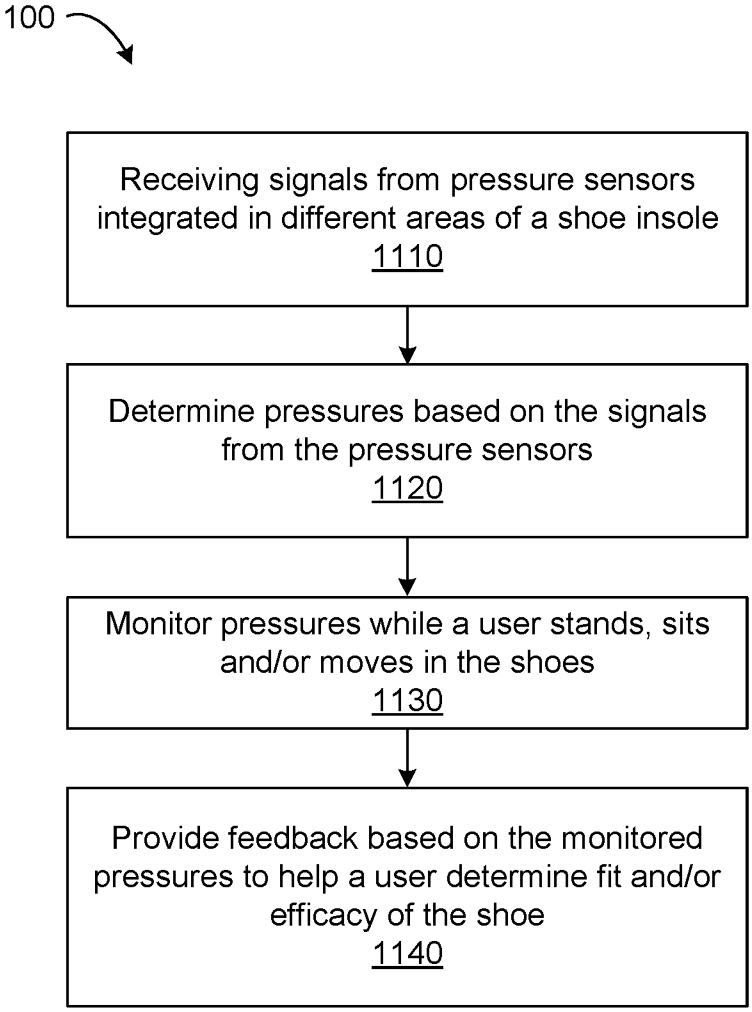
FIG. 11 is a flow chart of a method for sensing pressure in a shoe insole implementation of the present disclosure.

FIG. 11 is a flow chart of a method for sensing pressure in a shoe insole implementation of the present disclosure. The method 1100 includes receiving 1110 signals from pressure sensors integrated in different areas of a shoe insole. The method 1100 further includes determining 1120 pressures based on the signals from the pressure sensors. The method 1100 further includes monitoring 1130 the pressures while a user stands, sits, and/or moves (e.g., walks, runs, jumps, etc.) in the shoes. The method further includes providing 1140 feedback based on the monitored pressures to help the user determine fit (e.g., comfort) and/or efficacy (e.g., correction) of the shoe.

Some other implementations of the pressure sensor system can include smart shipping, measuring pressure on prosthetics, measuring gasket seals, grip strength testing, robotic feedback, and storage of sensitive materials. In smart shipping and storage, the foam aspect of the pressure sensor can allow for safe and protective contact with a packaged object while measuring vibrations and changes in applied forces during shipping. For grip strength testing, the foam of the pressure sensor can provide a comfortable padding while providing magnitude and location of pressure to test for early onset of diseases or measure progress over time. For measuring gasket seals, the compliance of the foam can help form a seal while providing specific force and position data to ensure a uniform and complete seal. For robotic feedback, a stiff and powerful robot may have the sensor incorporated into any moving part that could include a negative feedback loop. As an unexpected strain or pressure is detected on the moving system, the robot would pause operation or change course. It could also be used to guide the robot to the correct location or to the correct force when accomplishing a task.

In some aspects, the techniques described herein relate to a pressure sensing system including: a pressure sensor including: a dual-function foam configured to: generate a piezoelectric effect in response to a transient pressure; and generate a piezoresistive effect in response to a sustained pressure; and an electrode pair disposed on a surface of the dual-function foam; and a controller electrically coupled to the electrode pair, the controller configured to: receive a signal from the electrode pair, the signal corresponding to the piezoelectric effect or the piezoresistive effect; and select an operating mode from a plurality of operating modes based on the signal in order to measure the transient pressure or the sustained pressure, the plurality of operating modes including a static mode in which the controller is configured to measure the piezoresistive effect of the sustained pressure and a dynamic mode in which the controller is configured to measure the piezoelectric effect of the transient pressure.

These and other aspects can include one or more of the following, alone or in combination. For example, the controller can be configured to: select the static mode as the operating mode when the signal has no frequency above a frequency threshold, the static mode configured to measure the sustained pressure according to a resistance of the dual-function foam. In such implementations, to measure the sustained pressure, the controller can be configured to: transmit a transmit signal to the electrode pair; receive a receive signal from the electrode pair in response to the transmit signal; determine the resistance of the dual-function foam based on the transmit signal and the receive signal: compute a difference between the resistance and an expected resistance, the difference corresponding to the piezoresistive effect of the dual-function foam in response to the sustained pressure; and measure the sustained pressure based on the difference. The resistance can be calculated based on a root mean square signal. The expected resistance can be obtained from a calibration of the pressure sensor and stored in a memory of the controller. In some implementations, the plurality of operating modes include a sleep mode and the controller is further configured to: select the sleep mode as the operating mode when the sustained pressure is approximately zero for a time-out period, wherein in the sleep mode the controller consumes less power than in the static mode.

As another example, the controller can be configured to: select the dynamic mode as the operating mode when the signal has a frequency above a frequency threshold, the dynamic mode configured to measure the transient pressure according to a voltage of the dual-function foam. In some such implementations, to measure the transient pressure, the controller can be configured to: receive the voltage from the electrode pair, the voltage corresponding to the piezoelectric effect of the dual-function foam in response to the transient pressure; and measure the transient pressure based on the voltage. In some implementations, the controller can be further configured to: select a sleep mode as the operating mode when the transient pressure is approximately zero for a time-out period, wherein in the sleep mode the controller consumes less power than in the dynamic mode.

As another example, the controller can be configured to: select the operating mode based on a movement signal from an accelerometer operationally coupled to the pressure sensor and in communication with the controller. As another example, the electrode pair is a first electrode pair of a plurality of electrode pairs disposed on the surface of the dual-function foam, the controller further configured to: receive a plurality of signals from the plurality of electrode pairs; and map the transient pressure or the sustained pressure based on the plurality of signals.

In some aspects, the techniques described herein relate to a method for sensing pressure, including: receiving a signal from an electrode pair disposed on a dual-function foam, determining a frequency content of the signal; comparing the frequency content of the signal to a frequency threshold; measuring a transient pressure on the dual-function foam according to a voltage of the dual-function foam when the signal has frequency content above the frequency threshold; and measuring a sustained pressure on the dual-function foam according to a resistance of the dual-function foam when the signal has frequency content below the frequency threshold.

These and other aspects can include one or more of the following, alone or in combination. For example, measuring the transient pressure on the dual-function foam can include: receiving the voltage from the electrode pair, the voltage corresponding to a piezoelectric effect of the dual-function foam in response to the transient pressure; and measuring the transient pressure based on the voltage. As another example, measuring the sustained pressure can use a material model configured to compensate for drift in the resistance.

As another example, measuring the sustained pressure on the dual-function foam can include: transmitting a transmit signal to the electrode pair; receiving a receive signal from the electrode pair in response to the transmit signal; determining the resistance of the dual-function foam based on the transmit signal and the receive signal; computing a difference between the resistance and an expected resistance, the difference corresponding to a piezoresistive effect of the dual-function foam in response to the sustained pressure; and measuring the sustained pressure based on the difference. In some implementations, the transmit signal is a pulse width modulation (PWM) signal. In some implementations, determining the resistance of the dual-function foam based on the transmit signal and the receive signal can include computing a root mean square (RMS) of the receive signal.

In some aspects, the techniques described herein relate to a pressure sensing system including: a pressure sensor including: a dual-function foam configured to change electrical properties according to on a strain applied to the dual-function foam; a matrix of electrode pairs disposed on a surface of the dual-function foam, the electrode pairs arranged contiguously in a grid pattern so that the electrode pairs substantially cover the surface of the dual-function foam; and a controller electrically coupled to the electrode pairs, the controller configured to: receive signals from the electrode pairs, the signals from the electrode pairs corresponding to local strains in areas defined by the electrode pairs; and convert the local strains to a map of pressures on the surface of the dual-function foam.

These and other aspects can include one or more of the following, alone or in combination. For example, each electrode pair can include a first electrode having a first plurality of fingers and a second electrode coplanar with the first electrode and having a second plurality of fingers, wherein the first plurality of fingers and the second plurality of fingers are interdigitated. As another example, the dual-function foam can include a polymeric matrix, one or more conductive fillers, and voids. As another example, the signals can include one or more of: a voltage corresponding to a piezoelectric response to a transient pressure on the dual-function foam; and a voltage corresponding to a piezoresistive response to a sustained pressure on the dual-function foam.

As another example, a model of the dual-function foam can be used to convert the local strains to the map of pressures on the surface of the dual-function foam, the model generated using a calibration process. As another example, the controller can be configured to: enter a sleep mode to reduce a power consumed by the controller when the signals from the electrode pairs indicate no local strains in the areas defined by the electrode pairs: monitoring the matrix of electrode pairs for a voltage at any electrode pair in the matrix of electrode pairs that exceeds a threshold; and wake from the sleep mode when the voltage is detected.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite example relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. A pressure sensing system comprising:
- a pressure sensor including:
  - a dual-function foam configured to:
    - generate a piezoelectric effect in response to a transient pressure; and
    - generate a piezoresistive effect in response to a sustained pressure; and
  - an electrode pair disposed on a surface of the dual-function foam; and
- a controller electrically coupled to the electrode pair, the controller configured to:
  - receive a signal from the electrode pair, the signal corresponding to the piezoelectric effect or the piezoresistive effect; and
  - select an operating mode from a plurality of operating modes based on the signal in order to measure the transient pressure or the sustained pressure, the plurality of operating modes including a static mode in which the controller is configured to measure the piezoresistive effect of the sustained pressure and a dynamic mode in which the controller is configured to measure the piezoelectric effect of the transient pressure.

2. The pressure sensing system according to claim 1, wherein the controller is configured to:
- select the static mode as the operating mode when the signal has no frequency above a frequency threshold, the static mode configured to measure the sustained pressure according to a resistance of the dual-function foam.

3. The pressure sensing system according to claim 2, wherein to measure the sustained pressure, the controller is configured to:
- transmit a transmit signal to the electrode pair;
- receive a receive signal from the electrode pair in response to the transmit signal;
- determine the resistance of the dual-function foam based on the transmit signal and the receive signal;
- compute a difference between the resistance and an expected resistance, the difference corresponding to the piezoresistive effect of the dual-function foam in response to the sustained pressure; and
- measure the sustained pressure based on the difference.

4. The pressure sensing system according to claim 3, wherein the resistance is determined based on a root mean square of the receive signal.

5. The pressure sensing system according to claim 3, wherein the expected resistance is obtained from a calibration of the pressure sensor and stored in a memory of the controller.

6. The pressure sensing system according to claim 3, wherein the plurality of operating modes include a sleep mode and the controller is further configured to:

select the sleep mode as the operating mode when the sustained pressure is approximately zero for a time-out period, wherein in the sleep mode the controller consumes less power than in the static mode.

7. The pressure sensing system according to claim 1, wherein the controller is configured to:

select the dynamic mode as the operating mode when the signal has a frequency above a frequency threshold, the dynamic mode configured to measure the transient pressure according to a voltage of the dual-function foam.

8. The pressure sensing system according to claim 7, wherein to measure the transient pressure, the controller is configured to:

receive the voltage from the electrode pair, the voltage corresponding to the piezoelectric effect of the dual-function foam in response to the transient pressure; and measure the transient pressure based on the voltage.

9. The pressure sensing system according to claim 8, wherein the controller is further configured to:

select a sleep mode as the operating mode when the transient pressure is approximately zero for a time-out period, wherein in the sleep mode the controller consumes less power than in the dynamic mode.

10. The pressure sensing system according to claim 1, wherein the controller is configured to:

select the operating mode based on a movement signal from an accelerometer operationally coupled to the pressure sensor and in communication with the controller.

11. The pressure sensing system according to claim 1, wherein the electrode pair is a first electrode pair of a plurality of electrode pairs disposed on the surface of the dual-function foam, the controller further configured to:

receive a plurality of signals from the plurality of electrode pairs; and map the transient pressure or the sustained pressure based on the plurality of signals.

12. A method for sensing pressure, comprising:

receiving a signal from an electrode pair disposed on a dual-function foam;

determining a frequency content of the signal;

comparing the frequency content of the signal to a frequency threshold;

measuring a transient pressure on the dual-function foam according to a voltage of the dual-function foam when the signal has frequency content above the frequency threshold; and measuring a sustained pressure on the dual-function foam according to a resistance of the dual-function foam when the signal has frequency content below the frequency threshold.

13. The method for sensing pressure according to claim 12, wherein measuring the transient pressure on the dual-function foam includes:

receiving the voltage from the electrode pair, the voltage corresponding to a piezoelectric effect of the dual-function foam in response to the transient pressure; and measuring the transient pressure based on the voltage.

14. The method for sensing pressure according to claim 12, wherein measuring the sustained pressure on the dual-function foam includes:

transmitting a transmit signal to the electrode pair;

receiving a receive signal from the electrode pair in response to the transmit signal;

determining the resistance of the dual-function foam based on the transmit signal and the receive signal;

computing a difference between the resistance and an expected resistance, the difference corresponding to a piezoresistive effect of the dual-function foam in response to the sustained pressure; and measuring the sustained pressure based on the difference.

15. The method for sensing pressure according to claim 14, wherein the transmit signal is a pulse width modulation (PWM) signal.

16. The method for sensing pressure according to claim 14, wherein determining the resistance of the dual-function foam based on the transmit signal and the receive signal can include computing a root mean square (RMS) of the receive signal.

17. The method for sensing pressure according to claim 12, wherein measuring the sustained pressure uses a material model configured to compensate for drift in the resistance.

* * * * *